(12) United States Patent
Mora Villalobos et al.

(10) Patent No.: US 12,464,692 B2
(45) Date of Patent: Nov. 4, 2025

(54) APPARATUS AND METHOD FOR A DEFORMABLE EMI SHIELDING STRUCTURE

(71) Applicant: Intel Corporation, Santa Clara, CA (US)

(72) Inventors: Bernardo Mora Villalobos, Alajuela (CR); Alonso Rodriguez Chacon, La Guacima (CR)

(73) Assignee: Intel Corporation, Santa Clara, CA (US)

( * ) Notice: Subject to any disclaimer, the term of this patent is extended or adjusted under 35 U.S.C. 154(b) by 12 days.

(21) Appl. No.: 18/477,636

(22) Filed: Sep. 29, 2023

(65) Prior Publication Data

US 2025/0113471 A1 Apr. 3, 2025

(51) Int. Cl.
*H05K 9/00* (2006.01)
(52) U.S. Cl.
CPC ......... *H05K 9/0016* (2013.01); *H05K 9/0032* (2013.01); *H05K 9/0088* (2013.01)
(58) Field of Classification Search
CPC ........................... H05K 9/0015; H05K 9/0016
See application file for complete search history.

(56) References Cited

U.S. PATENT DOCUMENTS

| | | | | |
|---|---|---|---|---|
| 5,949,019 A | * | 9/1999 | Sirainen | H05K 9/0016 49/492.1 |
| 2003/0173100 A1 | * | 9/2003 | Flaherty | H05K 5/061 174/359 |
| 2012/0048612 A1 | * | 3/2012 | Bunyan | H05K 9/0016 174/358 |
| 2019/0297755 A1 | * | 9/2019 | Bodette | H05K 9/009 |

* cited by examiner

*Primary Examiner* — Hung V Ngo
(74) *Attorney, Agent, or Firm* — 2SPL Patent Attorneys PartG mbB; Kieran O'Leary

(57) ABSTRACT

A shielding structure and method for assembling a shielding structure for an electronic component. The shielding structure includes a core comprising an elastic material and at least a spring part of the core comprising an arch. The structure further includes an electromagnetic interference (EMI) shielding material affixed to the core. The method for producing the shielding structure includes forming a core comprising an elastic material, wherein the core includes at least a spring part comprising one or more arches. The method further includes covering at least a part of the core in an EMI shielding material.

19 Claims, 23 Drawing Sheets

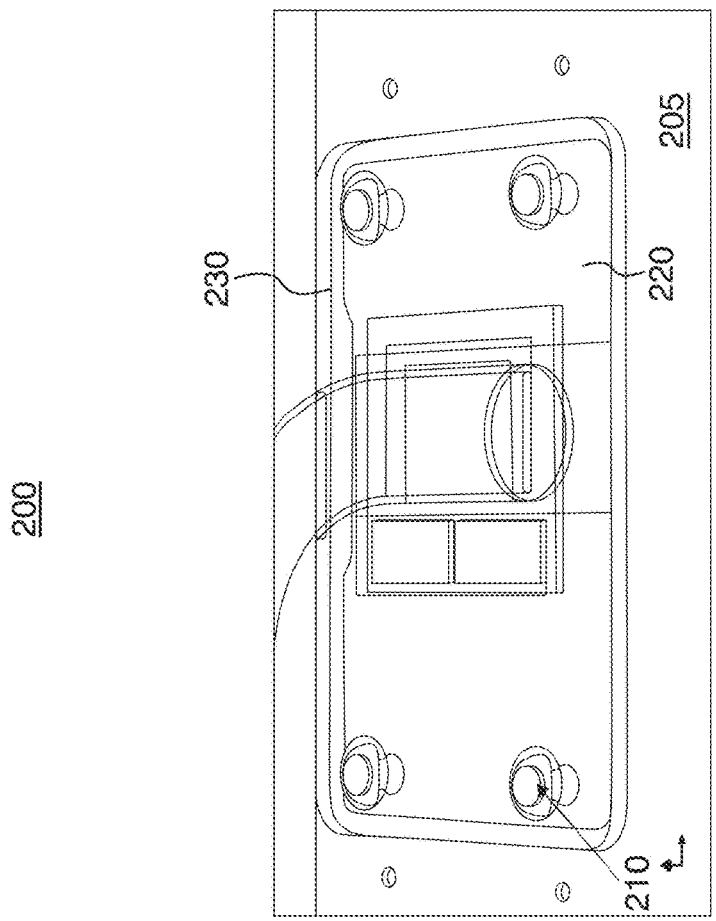
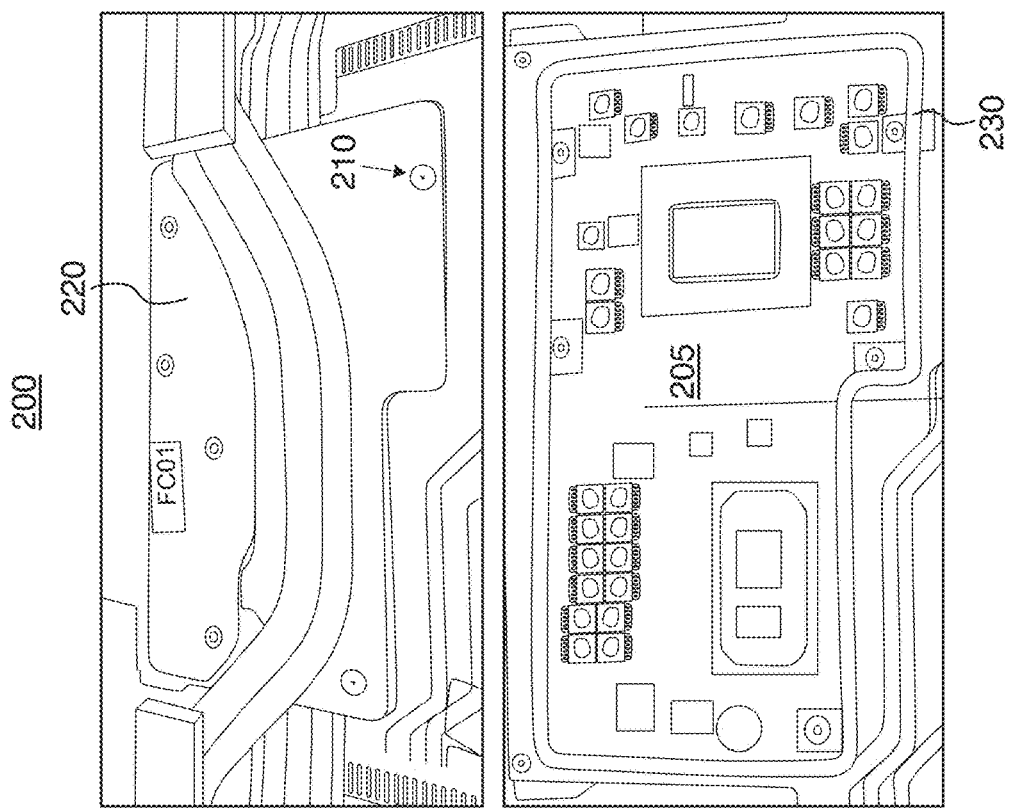
Fig. 2b
Fig. 2a

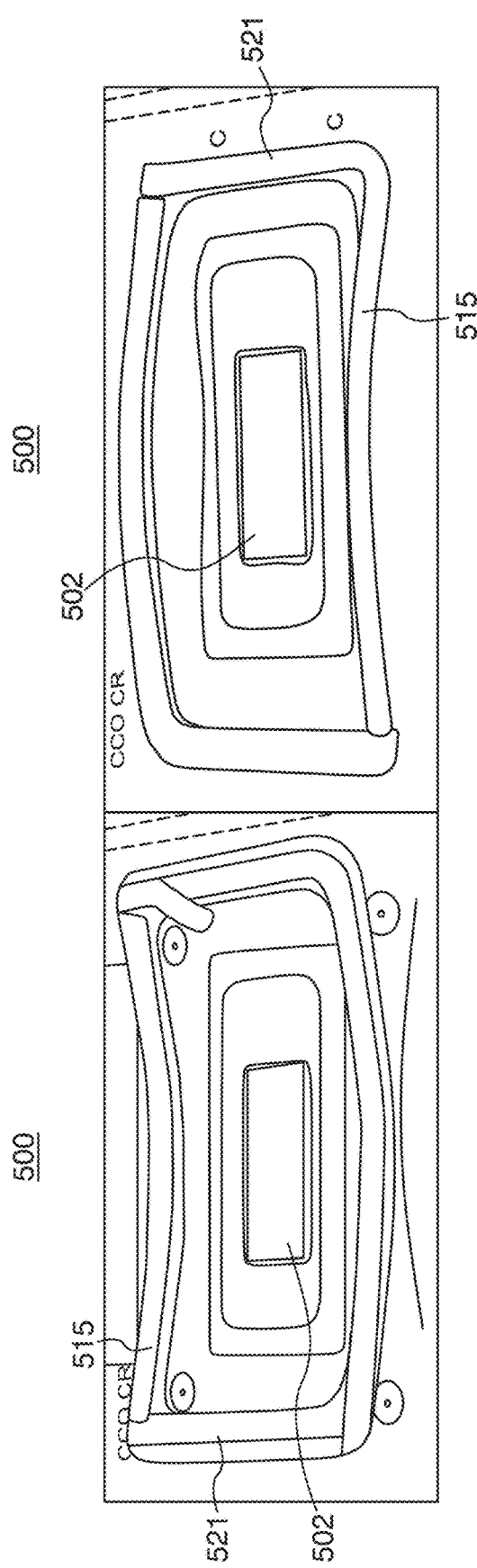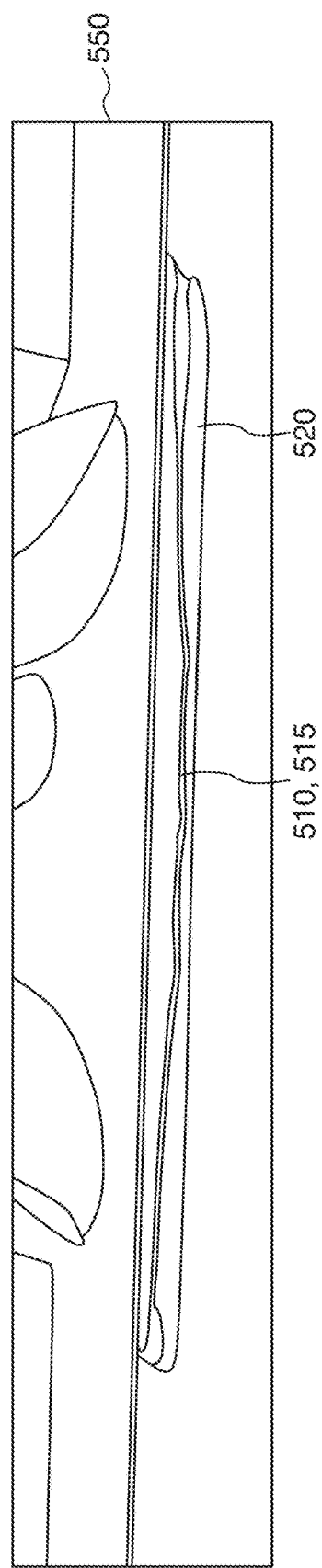
Fig. 5a  Fig. 5b  Fig. 5c

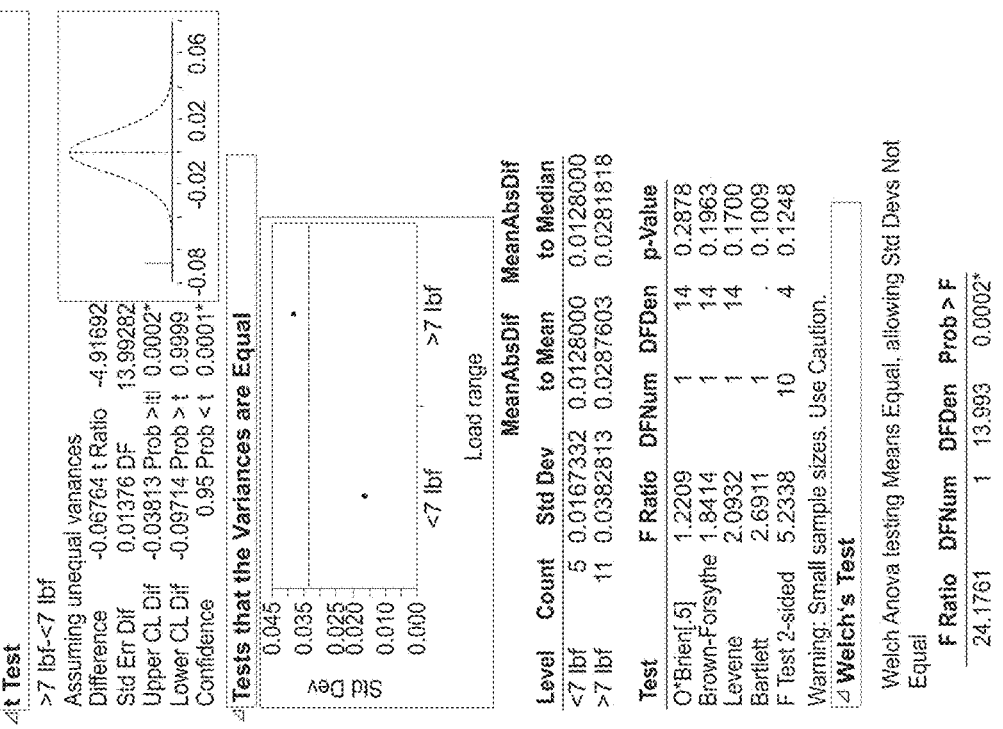
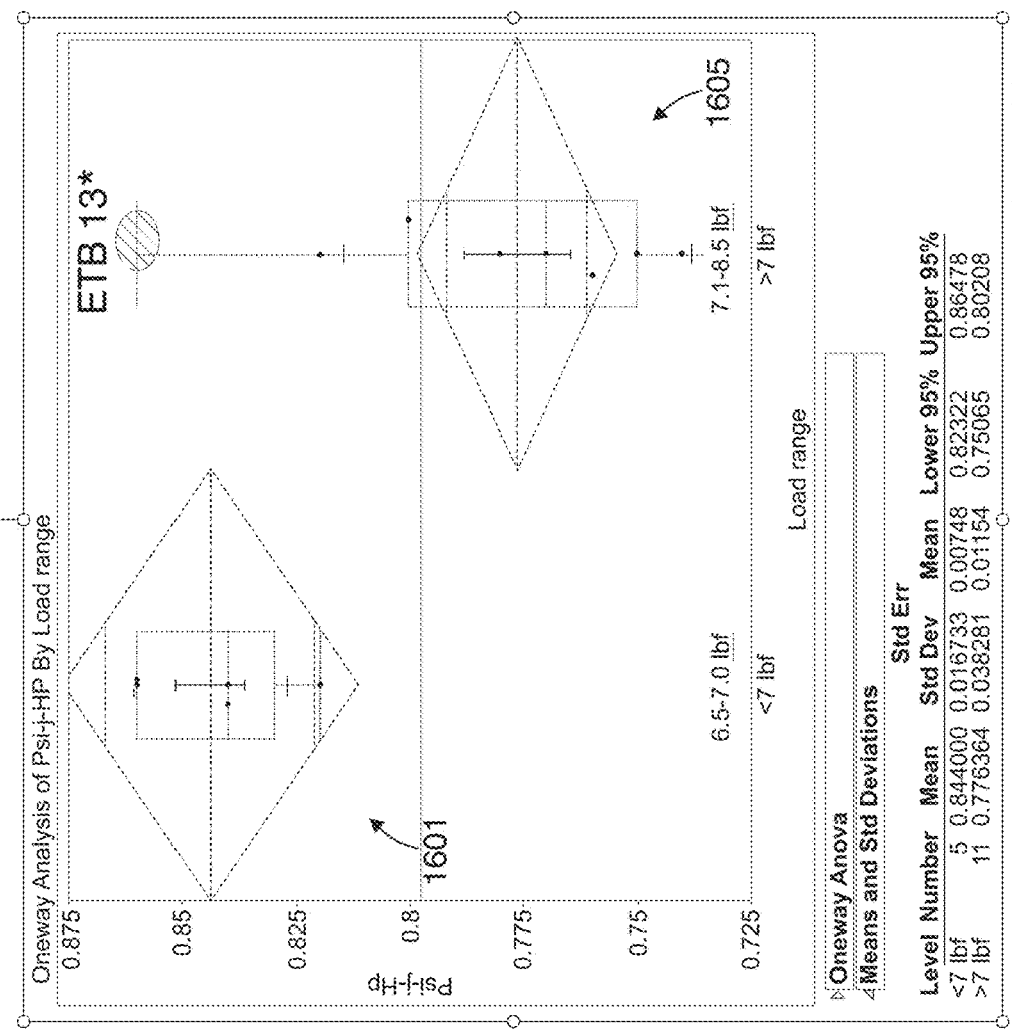
Fig. 16

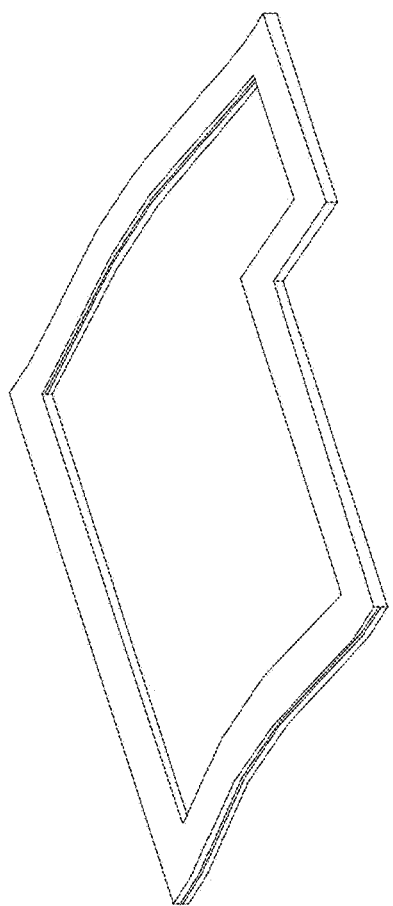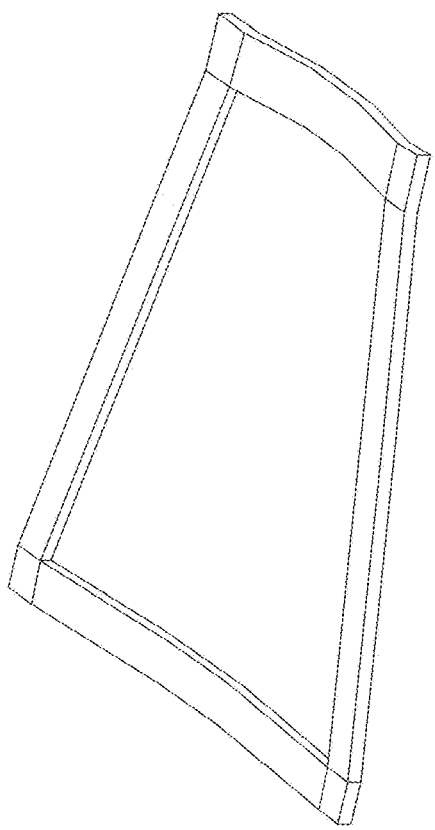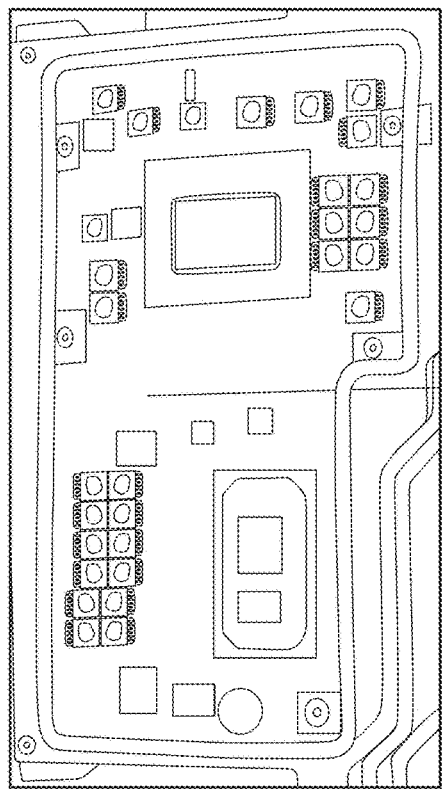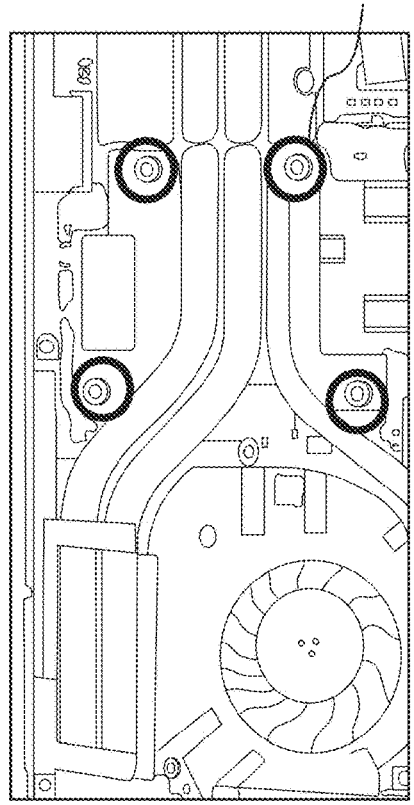

APPARATUS AND METHOD FOR A DEFORMABLE EMI SHIELDING STRUCTURE

BACKGROUND

As the design of electronic devices trends towards thinner and lighter products, the efficient design of internal components becomes increasingly important. Signal contamination in electronic devices is a recurrent and increasing issue, particularly as devices trend toward smaller form factors. Technologies such as 5G and Wi-Fi 7 are vulnerable to signal noise from the processors and memories. For this reason, and especially in small form factors, components such as the central processing unit (CPU) and memory packages are isolated from the rest of the system using electromagnetic interference (EMI) shields.

Electronic devices are also susceptible to twisting, warping, bending, and/or other external forces both in the fabrication and during the life of the device. When this happens, internal components, such as electronic packages, risk solder joint failure, cracks, and/or poor thermal performance due to the reduced pressure of thermal solutions. Thermal solution designs often suffer from uneven loading or concentrated edge and corner pressures over the heat source, such as electronic package dies. This uneven pressure loading is a potential die crack risk during system assembly or manufacturing, and a thermal inefficiency risk that can have performance implications over the life of the device.

Therefore, an improved apparatus and method for reducing signal contamination and improving load distribution in electronic devices is desired.

BRIEF DESCRIPTION OF THE FIGURES

Some examples of apparatuses and/or methods will be described in the following by way of example only, and with reference to the accompanying figures, in which

FIGS. 2A and 2B show some examples of solutions where deformable EMI solutions are used without offering any load or pressure distribution;

FIGS. 5A and 5B show a shielding structure surrounding an electrical component;

FIG. 5C shows the structures of FIGS. 5A and 5B when compressed in part by a stiffening structure;

FIG. 16 shows data collected from a thermal reference solution;

FIG. 19A shows an irregular EMI area;

FIG. 19B shows an EMI-spring multilayer for FIG. 19A;

FIG. 20A shows an asymmetric hole position;

FIG. 20B shows an EMI-spring multilayer for FIG. 20A;

DETAILED DESCRIPTION

Figure 1A:
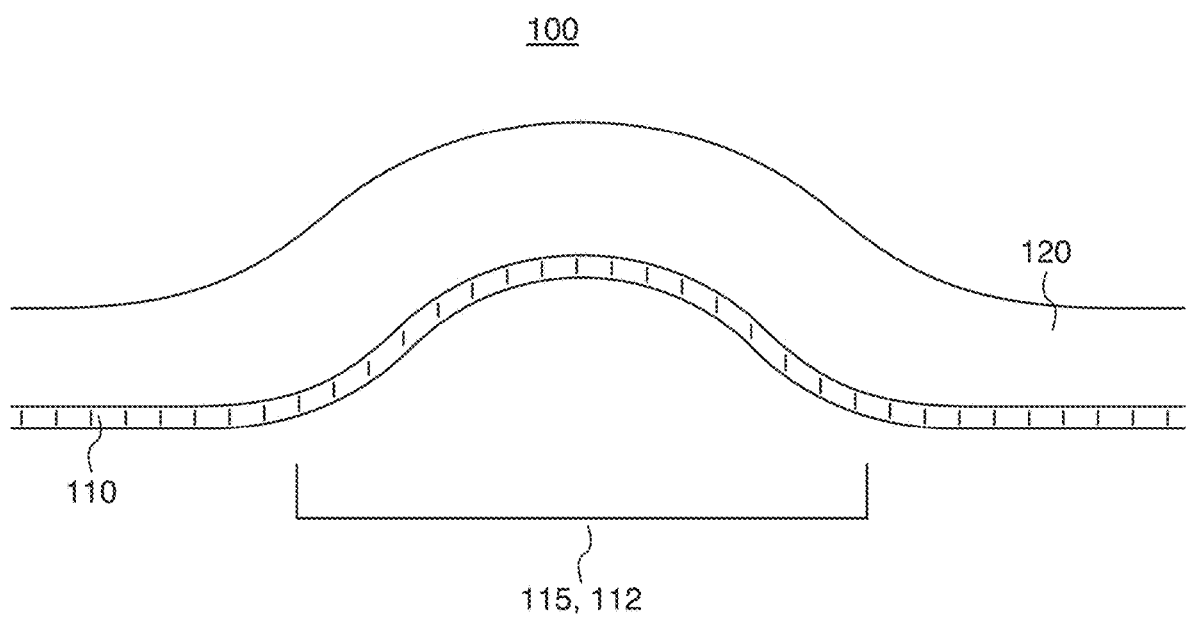
FIGS. 1A to 1C show schematic views of shielding structures.

Some examples are now described in more detail with reference to the enclosed figures. However, other possible examples are not limited to the features of these embodiments described in detail. Other examples may include modifications of the features as well as equivalents and alternatives to the features. Furthermore, the terminology used herein to describe certain examples should not be restrictive of further possible examples.

Throughout the description of the figures, same or similar reference numerals refer to same or similar elements and/or features, which may be identical or implemented in a modified form while providing the same or a similar function. The thickness of lines, layers, and/or areas in the figures may also be exaggerated for clarification.

When two elements A and B are combined using an "or," this is to be understood as disclosing all possible combinations, i.e. only A, only B as well as A and B, unless expressly defined otherwise in the individual case. As an alternative wording for the same combinations, "at least one of A and B" or "A and/or B" may be used. This applies equivalently to combinations of more than two elements.

If a singular form, such as "a," "an," and "the" is used and the use of only a single element is not defined as mandatory either explicitly or implicitly, further examples may also use several elements to implement the same function. If a function is described below as implemented using multiple elements, further examples may implement the same function using a single element or a single processing entity. It is further understood that the terms "include," "including," "comprise," and/or "comprising," when used, describe the presence of the specified features, integers, steps, operations, processes, elements, components, and/or a group thereof, but do not exclude the presence or addition of one or more other features, integers, steps, operations, processes, elements, components and/or a group thereof.

In the following description, specific details are set forth, but examples of the technologies described herein may be practiced without these specific details. Well-known circuits, structures, and techniques have not been shown in detail to avoid obscuring an understanding of this description. "An example/example," "various examples/examples," "some examples/examples," and the like may include features, structures, or characteristics, but not every example necessarily includes the particular features, structures, or characteristics.

Some examples may have some, all, or none of the features described for other examples. "First," "second," "third," and the like describe a common element and indicate different instances of like elements being referred to. Such adjectives do not imply element item so described must be in a given sequence, either temporally or spatially, in ranking, or any other manner. "Connected" may indicate elements are in direct physical or electrical contact with each other and "coupled" may indicate elements co-operate or interact with each other, but they may or may not be in direct physical or electrical contact.

As used herein, the terms "operating," "executing," or "running" as they pertain to software or firmware in relation to a system, device, platform, or resource are used interchangeably and can refer to software or firmware stored in one or more computer-readable storage media accessible by the system, device, platform, or resource, even though the instructions contained in the software or firmware are not actively being executed by the system, device, platform, or resource.

The description may use the phrases "in an example/example," "in examples/examples," "in some examples/examples," and/or "in various examples/examples," each of which may refer to one or more of the same or different examples. Furthermore, the terms "comprising," "including," "having," and the like, as used with respect to examples of the present disclosure, are synonymous.

Figure 1B:
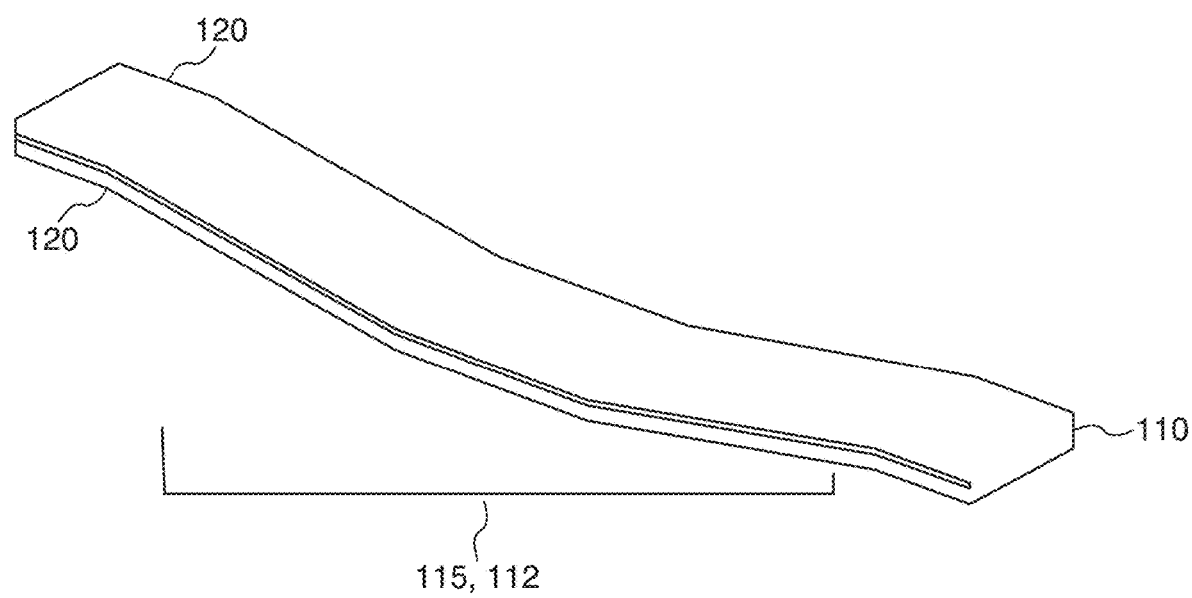
Figure 1C:
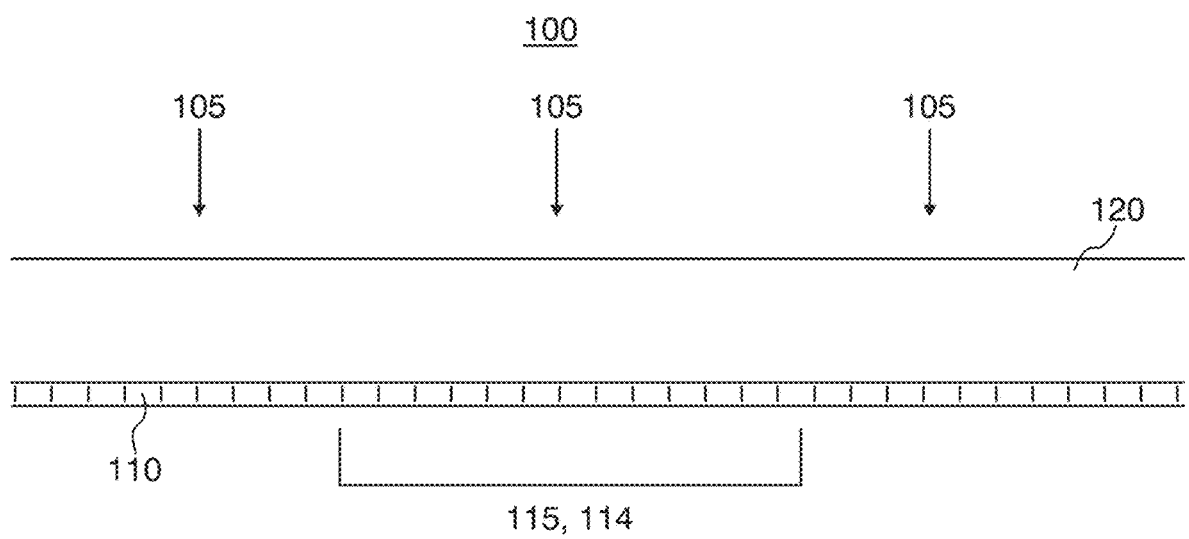

FIGS. 1A to 1C show schematic views of shielding structures 100 (EMI-spring multilayer systems). FIG. 1A shows a schematic cross-section of a shielding structure 100 for an electronic component. The shielding structure 100 includes a core 110 comprising an elastic material and at least a spring part 115 of the core comprising an arch 112. The shielding structure further includes an electromagnetic interference (EMI) shielding material 120 affixed to the core 110.

The shielding structure 100 uses a deformable EMI material or solution combined with a pre-formed spring core. This EMI-spring multilayer system may reduce the system-on-a-chip (SoC) EMI signals to the system, and at the same provide frame support, minimize deformation, and avoid transient load compression peaks during thermal solutions attach and improve final pressure distribution over a heat source (e.g. the SoC).

The shielding structure 100 is a multi-layer apparatus that may be a spring solution alternative, such as for leaf springs, linear springs, or conical springs. This shielding structure 100 combines an EMI shielding material 120 with a core 110, such as a pre-formed leaf spring.

In some embodiments, the shielding structure acts as the loading mechanism system for a thermal solution. The shielding structure 100 may optimize the load and pressure over a die of a processor while maintaining the EMI noise containment.

A shielding structure 100 may serve as a component designed to effectively mitigate electromagnetic interference. This structure includes one or more EMI materials 120 and is strategically placed in proximity to an electrical component to create a barrier, preventing the emission of electromagnetic noise from the component and also safeguarding it from external interference. By providing reliable EMI shielding, this structure helps maintain the integrity of any electronic device it is a part of, ensuring optimal signal transmission, reduced electromagnetic interference-related issues, and enhanced overall performance and reliability of electronic systems employing the electronic component.

The EMI shielding material 120 may include one or more materials selected from the group consisting of electrically conductive elastomers. conductive foam materials. conductive gaskets, metal-coated fabrics, conductive polymers, and conductive composites.

The core 110 includes an elastic material as a spring part 115, which may be any substance or composition possessing the inherent property of elasticity, characterized by its ability to undergo deformation when subjected to an external force and subsequently return to its original shape and size upon the removal of said force. These materials may be employed to construct springs, which utilize this property to store and release mechanical energy efficiently, making them suitable for various applications in industries requiring resilience, shock absorption, and controlled deflection characteristics. Examples of elastic materials include metals (e.g. steel alloys or copper alloys), rubber compounds, and synthetic polymers, all of which exhibit the capacity to deform and recover, making them well-suited for spring applications across diverse industries.

The core 110 may include one or more materials selected from the group consisting of steel, copper, nickel, titanium, aluminum, zinc, brass, rubber, and an elastomer. Selecting the right core may offer diverse advantages. Certain materials may complement the conductivity of the EMI shield material while others may offer benefits in strength, elasticity, weight, or corrosion resistance. The material choice may depend on load requirements, environmental conditions, and specific performance needs.

The core 110 or spring part 115 may minimize the edge and corner pressures over a component of an electronic device, such as a processor die. This may reduce the risk of the component cracking and may assist with the distribution of pressure across the component. For example, the shielding structure 100 of the electronic component may be affixed to a circuit board (e.g. printed circuit board (PCB)) and placed adjacent to a processor die. When that shielding structure 100 is then layered beneath a thermal solution affixed to the die, the shielding structure may assist with the pressure distribution of the thermal solution across the die. An improved pressure distribution may improve thermal capability while maintaining the EMI noise containment as one single part.

A spring or spring part 115 is a mechanical component that is designed to store and release mechanical energy. It is characterized by its ability to deform when a force is applied and then return to its original shape when the force is removed. Springs are widely used in various applications to provide tension, compression, and/or torsion forces, enabling them to serve purposes such as shock absorption, maintaining contact pressure, storing energy, and/or facilitating mechanical movement.

A spring part 115 may release its stored potential energy into kinetic energy, causing the spring to push or pull directly on an object, thereby exerting a force (e.g. a load force). The force may be directly exerted on an affixed, abutting, and/or otherwise adjacent component. The force may also be indirectly exerted or applied to a series of components in direct contact or indirect contact with the spring. This direct and indirect application of force may aid with dampening vibrations or facilitating contact pressure between components.

A load force, in the context of a spring, spring part, or leaf spring application, may refer to the force exerted on a processor (e.g. CPU or GPU) or another component to ensure proper mechanical contact or thermal conductivity. A load force may be generated by the compression or tension of the shielding structure or components to which it is connected. For example, if the shielding structure is flexed, the resulting load force may be applied to a component stack. This may ensure sufficient pressure between, for example, a processor and its heatsink or thermal interface material. This pressure may promote effective heat transfer and may help maintain the optimal thermal performance of the processor. When a stiffening structure, such as a lid or thermal solution, is attached to the shielding structure and connected by the fastener, adhesive, or friction, the shielding structure transfers a part of the load force to the stiffening structure.

When a core 110 and an EMI shielding material 120 act together as a load system they may eliminate or reduce other spring hardware (e.g., compression, conical, or leaf springs) from the design of the electronic device. This may reduce costs and simplify the bill of materials. At the same time, the system Z-stack (height or distance in the z dimension) form factor (either in the device's internal components or overall device height) may be improved. This may be beneficial where internal component designs require compression or conical springs as a loading mechanism. Further, since extended leaf springs may be eliminated, the implementation of the EMI-spring system (shielding structure) may have the potential to reduce the footprint of the thermal and EMI shield mechanisms of the internal systems of the electronic device. Combining the role of the shielding structure 100 may also simplify the design and assembly of the electronic device by optimizing space and component count, reducing overall manufacturing costs and complexity, increasing the reliability of the device, and simplifying repair.

The core 110 may be wire shaped wire-shaped or, as shown in FIG. 1B, ribbon-shaped. A wire core may provide a compact and light solution for EMI shielding and load-bearing in an electronic device. It may also offer a simplified design and may be appropriate where more EMI shielding is desired. Additionally, a wire core may be more versatile for customizing the shape of the core 110 or the spring part 115. Particularly, when the core is extended in more complex shapes (see, for example, FIGS. 19A to 21B). A ribbon core may offer increased flexibility and resilience in the spring part 115, providing effective shock absorption and vibration damping. It also may provide increased reliability in the deformation of the spring part 115. A flat, elongated design allows for efficient space utilization, making it suitable for compact systems and structures.

FIG. 1C shows the shielding structure 100 where the spring part 115 elastically deforms towards a deformable state shape 114 when subjected to a compressive force 105. A deformable state shape may be a configuration or form of the spring part 115 when it undergoes a change in its physical shape, structure, or geometry in response to external forces, pressures, or conditions. This state is characterized by the spring part's 115 ability to undergo elastic or plastic deformation, altering its dimensions or appearance temporarily or permanently while maintaining its integrity. The deformable state shape may be flat or substantially flat.

More details and aspects are mentioned in connection with the embodiments described above or below. The examples shown in FIGS. 1A to 1C may comprise one or more optional additional features corresponding to one or more aspects mentioned in connection with the proposed concept or one or more examples described above or below.

Prior applications for deformable EMI solutions (foams, gaskets) focus only on EMI containment. The use of deformable EMI was not previously considered in attachment mechanisms to have a significant load and pressure distribution over the SoC or other electronic components.

FIGS. 2A and 2B show some examples of solutions where deformable EMI solutions are used without offering any load or pressure distribution. For example, in FIG. 2A a combined CPU and GPU frame thermal solution 200 with EMI a perimeter 230 is shown. The frame 220 of the thermal solution may be attached using conical springs 210. An EMI foam shield 230 may be installed around the perimeter of the frame 220. This seals the opening between the frame 220 and the board 205. However, conical springs 210 have a compressed solid state length. The solid compress length of the conical spring 210 limits the minimal Z-stack possible for this solution. The force is located at conical springs 210, so the final load made by the thermal solution over the die is a combination of the conical springs and the frame deformation.

Furthermore, in FIG. 2B a single package frame thermal solution 200 with EMI perimeter 230 is shown. The frame 220 of the thermal solution 200 may be attached using springs-washers 210. An EMI foam shield 230 would be installed around the perimeter of the frame 220, sealing the opening between the frame 210 and the board 205. However, the screw length travel drives the final load and the frame's deformation defines the final die pressure map over the die. Therefore, the use of a novel deformable EMI solution or shielding structure, as described above and below, offers improvements not found in prior art.

Figure 3A:
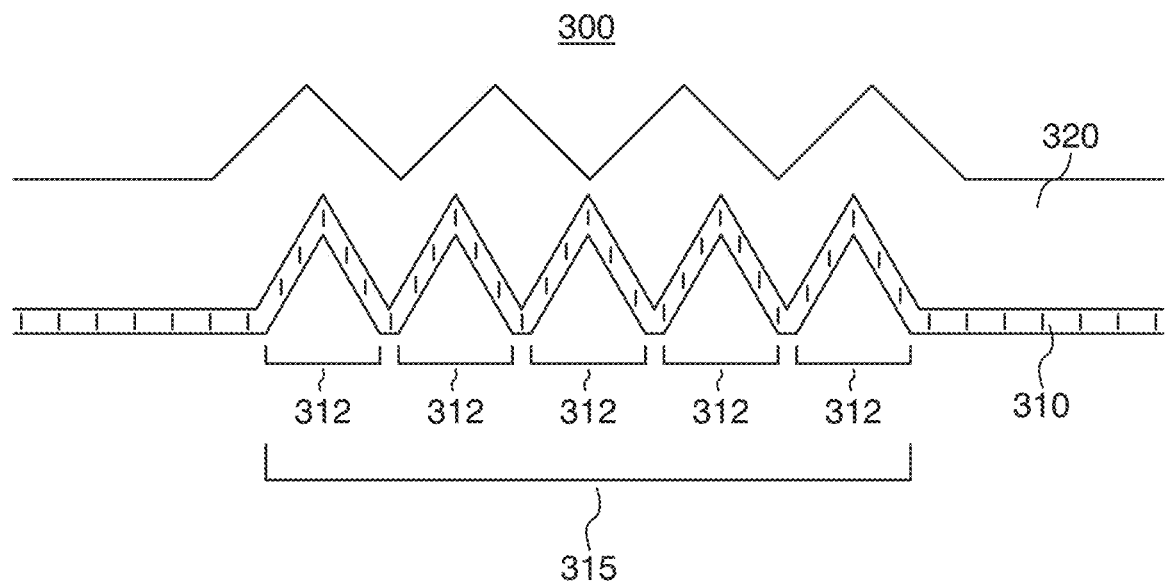
FIGS. 3A and 3B show schematic views of shielding structures with various arches.
Figure 3B:
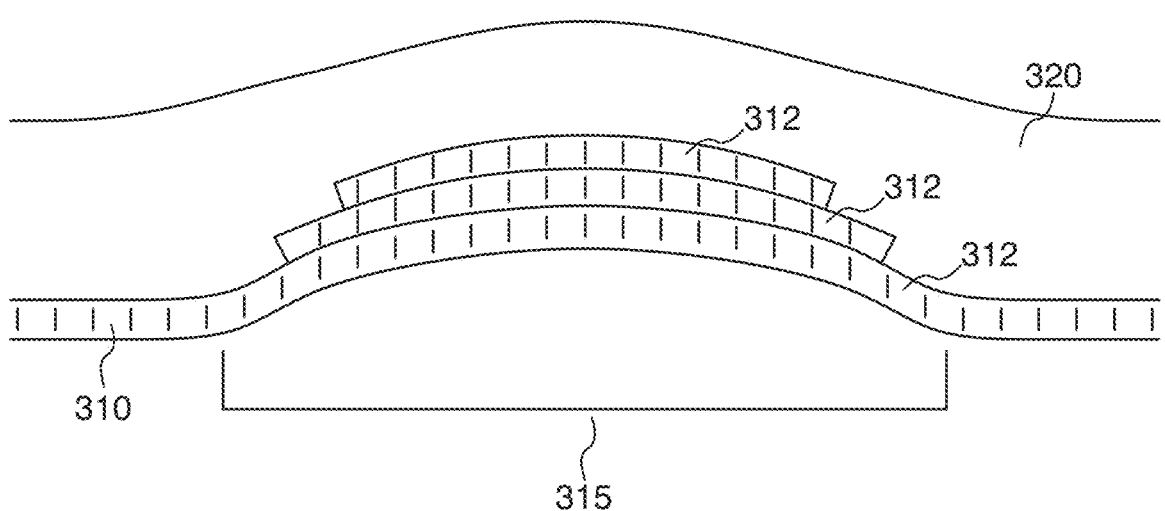

FIGS. 3A and 3B show schematic views of shielding structures 300 wherein the arch 312 of the spring part 315 comprises at least one of a segmental arch, a round arch, a triangular arch, or a trapezoidal arch. Various types of arch 312 are beneficial when used in a spring part 315. A segmental arch and round arch may offer a balanced distribution of stress and load across their curved shape, reducing the risk of concentrated stress points and enhancing durability, resulting in excellent load-bearing capacity and resilience. The simplicity of segmental and round arches may make them cost-effective to manufacture and maintain Triangular arches 312, as shown in FIG. 3A, may offer space-efficient designs, making them suitable for applications with limited installation space. They also may offer more predictable load distribution, contributing to consistent and reliable performance. Trapezoidal arches may combine the benefits of triangular and round arches by providing strength and flexibility while offering some space efficiency. The choice of arch shape depends on the specific requirements of the application, including load capacity, space constraints, and desired performance characteristics.

Using more than one arch in a spring part, known as a multi-leaf (e.g. FIG. 3B) or multi-arch configuration (e.g. FIG. 3A), delivers increased load-bearing capacity, improved resilience, and progressive rate characteristics, making it ideal for heavy-duty applications like trucks and trailers. This arrangement not only enhances shock absorption and ride comfort but also provides redundancy and reliability in case of individual arch failure, contributing to greater longevity and consistent performance. Customizability, compatibility with varied applications, and a reduced risk of fatigue further underline the benefits of multi-arch leaf springs, making them a versatile and reliable choice in numerous industries. Arches may be arranged in sequence, such as in FIG. 2A, or in parallel (e.g. as a leaf spring) such as in FIG. 2B.

More details and aspects are mentioned in connection with the embodiments described above or below. The examples shown in FIGS. 3A and 3B may comprise one or more optional additional features corresponding to one or more aspects mentioned in connection with the proposed concept or one or more examples described above or below.

Figure 4A:
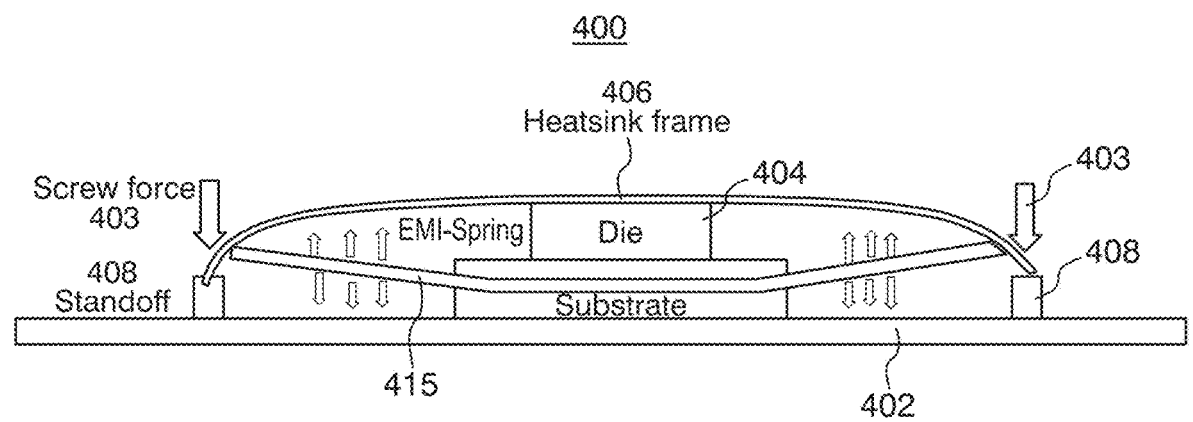
FIGS. 4A and 4B show a shielding structure on a circuit board with an electrical component.
Figure 4B:
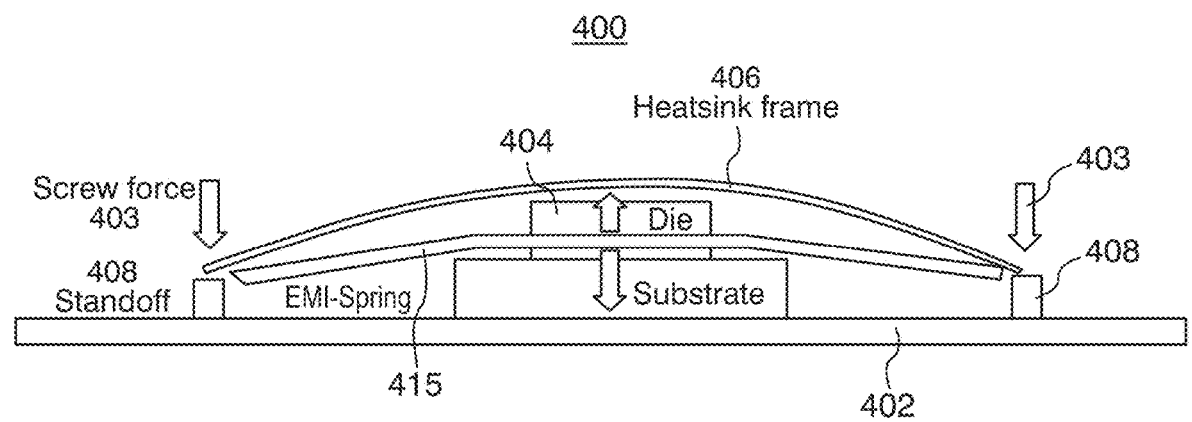

FIGS. 4A and 4B show a shielding structure 400 on a circuit board 402 with an electrical component like a processor die 404. FIG. 4A shows a convex shape design of the spring part 415 and the associated reaction force location. FIG. 4B shows a concave shape design of the spring part 415 and the associated reaction force location. The figures also show a heatsink frame 406 as a stiffening structure, the screw forces 403 and standoffs 408 to which the heatsink frame 406 and the shielding structure 400 are attached to the circuit board 402.

Convex may refer to a curved surface or shape exhibiting an outwardly protruding contour. A convex shape design could be used to optimize the heatsink frame's deformation. The shielding structure applies its maximum force far away from a die or other electronic component. Hence, the component and the shielding structure reaction forces are distributed below the heatsink frame. The force distributed below the heatsink frame controls its deformation.

Concave may refer to a curved surface or shape characterized by an inwardly curving contour, creating a recessed or hollow configuration. A concave shape design could be used to reduce the load over the die. The shielding structure applies its maximum force near the die's location. Hence, the die and the shielding structure reaction forces are applied in the middle of the heatsink frame, so the total force over the die is lower.

More details and aspects are mentioned in connection with the embodiments described above or below. The examples shown in FIGS. 4A and 4B may comprise one or more optional additional features corresponding to one or more aspects mentioned in connection with the proposed concept or one or more examples described above or below.

FIGS. 5A and 5B show a shielding structure 500 surrounding an electrical component like a processor die 502. The shielding structure 500 includes two spring parts 515 exhibiting a convex (FIG. 5A) or concave (FIG. 5B) shape and joined together at proximal and distal ends, respectively. FIG. 5C shows that the convex or concave shapes when compressed in part by a stiffening structure 550. The EMI material 520 and the core 510 are deformed into a substantially linear shape.

FIG. 5B shows a concave shape to generate lateral opposite forces. FIG. 5A shows a convex share to generate center opposite forces. FIG. 5C shows a shielding structure creating EMI shielding when compressed. In FIGS. 5A and 5B, the core extends laterally along a first part of a circumference of the shielding structure and a coreless part extends laterally along a second part of the circumference of the shielding structure. Using a shielding structure to surround an electronic component, such as an SoC, may reduce the EMI signals to the system, and at the same provide frame support, minimize deformation, avoid transient load compression peaks during thermal solutions attach, and improve final pressure distribution over the heat source.

The shielding structure may include a second core and second coreless part, wherein the core and second core are joined by the coreless part and the second coreless part. As shown in FIGS. 5A and 5B, the core and second core may be joined at respective proximal ends by the coreless part at respective distal ends by the second coreless part.

The shielding structure 500 may laterally surround an electrical component 502. Surrounding or partially surrounding an electrical component with more than one core 510 may improve the load distribution of forces on the electrical component while also shielding it laterally in all directions from EMI. The shielding structure may be designed as an EMI fence or a protective fence to mitigate electromagnetic interference, particularly in the lateral direction. For example, this structure is constructed from conductive materials and forms a barrier around a semiconductor device (e.g. a processor). It may be integral to the circuit board or affixed at its bottom to the circuit board. At its top, it may be affixed to a lid, such as an EMI lid or a protective lid. The shielding structure 500 may effectively contain electromagnetic emissions generated by the internal circuitry and minimize their impact on neighboring electrical components. The shielding structure acts as a shield, impeding the ingress or egress of external electromagnetic signals, thereby preserving the integrity of an enclosed processor (or other components), and promoting the optimal performance of the electronic device or package as a whole. This may result in improved signal integrity and reduced risks of performance degradation or data corruption in the electronic device.

The shielding structure may include a coreless part 521 comprising the EMI shielding material. Where a spring part is not necessary or desired only an EMI material may be present. The structure may be complemented with an EMI section without a core spring to contain other EMI noise areas where strength enforcement is not required. As shown with the simulation results summarized below, this may improve the performance of existing thermal solutions without utilizing any additional volume or footprint in an electronic device. This may simplify construction, such as in FIG. 9 where two spring parts are connected in a ladder configuration to laterally surround a processor die.

The electrical component may be a processor (e.g. CPU, GPU, XPU, microcontroller, and/or digital signal processor), a processor die, a memory, a transceiver, or other component. These components, which are often found on a PCB, enable the processing, storage, and/or manipulation of electrical signals and data within an electronic device. Using a shielding structure 500 for an electronic component may decrease the electrical failure risk of a CPU and other electrical components 502.

The EMI shielding material 520 may be a compressible material. As shown in FIG. 5C, the EMI shielding material 520 may be placed or attached above, below, or on both sides of a preformed spring (metallic or any other elastic material). An EMI material may be a substance or composite structure specifically engineered to mitigate or shield against electromagnetic interference, thereby preventing the transmission or reception of undesirable electromagnetic signals in electronic, electrical, or communication systems. Exemplary EMI materials include, but are not limited to, electrically conductive elastomers, conductive foams, metal-coated fabrics, graphene-based composites, and ferrite-based composites, wherein these materials effectively attenuate electromagnetic waves or a noise within a defined frequency range, thus ensuring electromagnetic compatibility and signal integrity in sensitive electronic devices and components.

The EMI shielding material 520 may possess the capacity for deformation and recovery under mechanical compression while simultaneously providing effective electromagnetic interference shielding. A notable benefit of this compressibility is its ability to conform to irregular shapes and varying gaps within electronic enclosures or devices. This enables the material to maintain continuous and reliable contact between shielding surfaces, thereby ensuring consistent EMI protection across complex geometries and providing enhanced shielding performance in challenging installation scenarios. When an EMI material compresses it may cover the core, providing a shield that absorbs, reflects, and diverts electromagnetic waves.

The EMI shielding material 520 may be electrically conductive. Conductivity may improve EMI shielding performance, where electrical conductivity enables the efficient absorption, dissipation, and redirection of electromagnetic waves. Such materials may enhance electromagnetic compatibility, ensuring the integrity of sensitive electronic devices and systems by preventing interference and signal degradation, consequently contributing to enhanced safety, reduced operational risks, and reliable performance in various applications. These materials may include electrically conductive elastomers, conductive foams, metal-coated fabrics, conductive polymers, and metal sheets or foils Non-conductive materials may also be used. Non-conductive EMI materials may act as electrical insulation, preventing short circuits or unintended electrical connections. They are particularly useful in applications requiring dielectric properties, like capacitors. Examples include ceramic materials, plastics, glass, and certain composites, all of which provide effective electrical insulation while also contributing to reduced electromagnetic interference.

The EMI shielding material 520 may encase the core when subjected to a compressive force. As the material is deformed it may wrap around the core to improve the EMI shielding when the structure is compressed. In this way, the core may be visible or partially visible in an uncompressed state and then not visible when the structure is compressed. The EMI material may be present on an upper and lower area of the core. The EMI material may be one continuous material with a slot or crevice for the core to fit into so that the EMI material wraps around the core. Using one EMI material may improve the encapsulation of the core and the blocking of interference. The core could also be encased by two EMI materials one on an upper area and one on a lower area of the core. Using two EMI materials may simplify manufacturing and ease of assembly.

The EMI shielding material 520 may be a foam material or a gasket material. Foams and gaskets may be capable of precisely, conforming to complex shapes and filling gaps within electronic devices ensuring efficient and reliable protection against electromagnetic interference. A gasket may offer additional environmental shielding ensuring protection against moisture, dust, and contaminants.

The EMI shielding material 520 may be affixed to the core. Affixing the shielding material to the core may provide increased accuracy when assembling and compressing the structure and streamline the manufacturing of the structure.

More details and aspects are mentioned in connection with the embodiments described above or below. The examples shown in FIGS. 5A to 5C may comprise one or more optional additional features corresponding to one or more aspects mentioned in connection with the proposed concept or one or more examples described above or below.

Figure 6A:
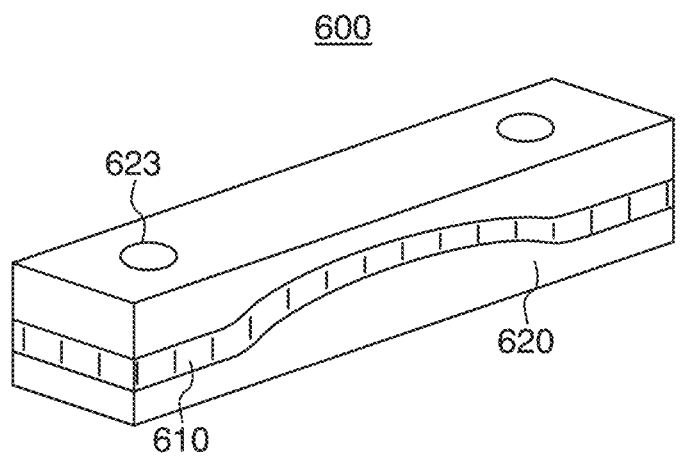
FIGS. 6A to 6C show a shielding structure that may include an eyelet.
Figure 6B:
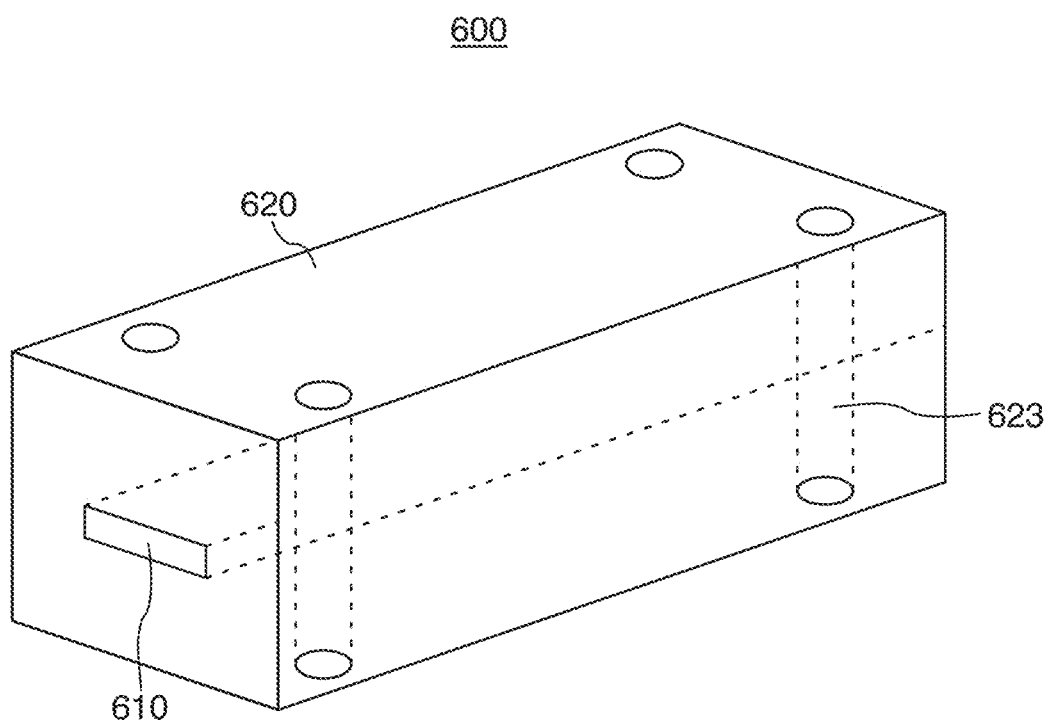
Figure 6C:
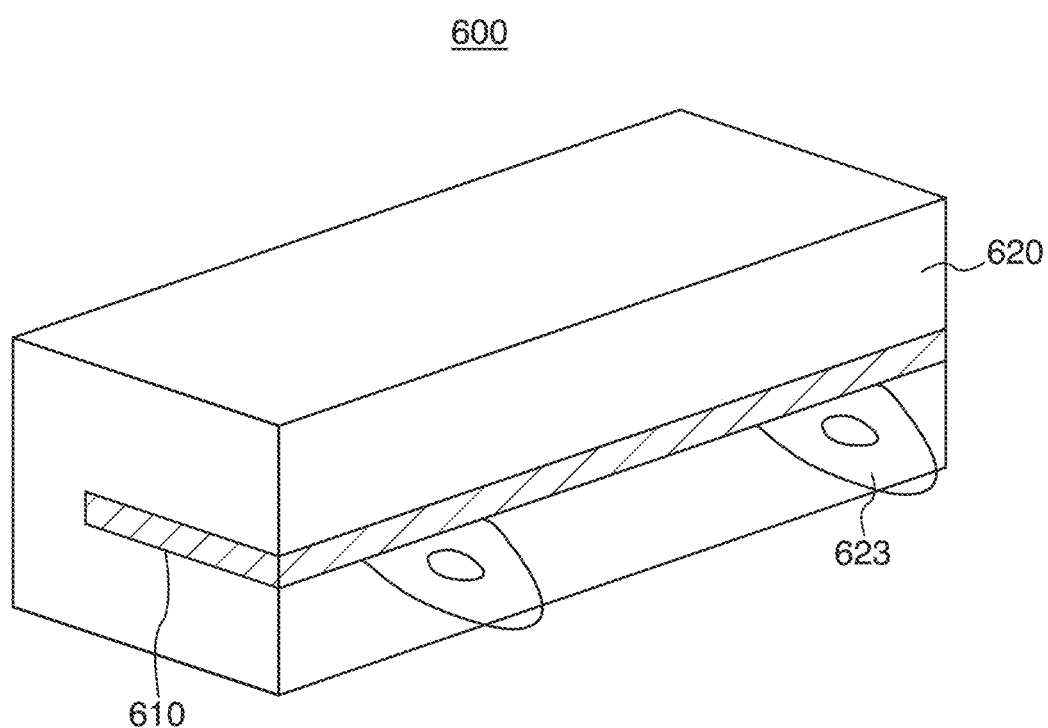

FIGS. 6A to 6C show a shielding structure 600 that may include an eyelet, grommet, or other aperture 623. The eyelet 623 may be reinforced to provide additional strength or protection. An eyelet or other fastener may allow for the shielding structure to be attached to a circuit board, thermal solution, or other structure. Holes or eyelets in the shielding structure 600 may have the same location of thermal solution mounting hole positions. These holes passing from a top or upper side of the shielding structure to a bottom or lower side of the structure may allow for fasteners, like screws or rivets, to affix the structure to other structures without compromising the shielding properties of the EMI material. A screw, rivet, clip, or other fastener may also be integrated into the shielding structure itself. FIG. 6A shows eyelets 623 passing through the core 610 and the EMI material 620. FIG. 6B shows eyelets 623 passing only through the EMI material 620. FIG. 6C shows eyelets 623 only passing through a core 610. Affixing the eyelets to the core or EMI shielding may allow the shielding structure to be affixed to a circuit board in positions offset from the resting position of the shielding structure. This may allow existing screws or other fasteners to be used without requiring holes directly through the main mass of the shielding structure.

More details and aspects are mentioned in connection with the embodiments described above or below. The examples shown in FIGS. 6A to 6C may comprise one or more optional additional features corresponding to one or more aspects mentioned in connection with the proposed concept or one or more examples described above or below.

Figure 7:
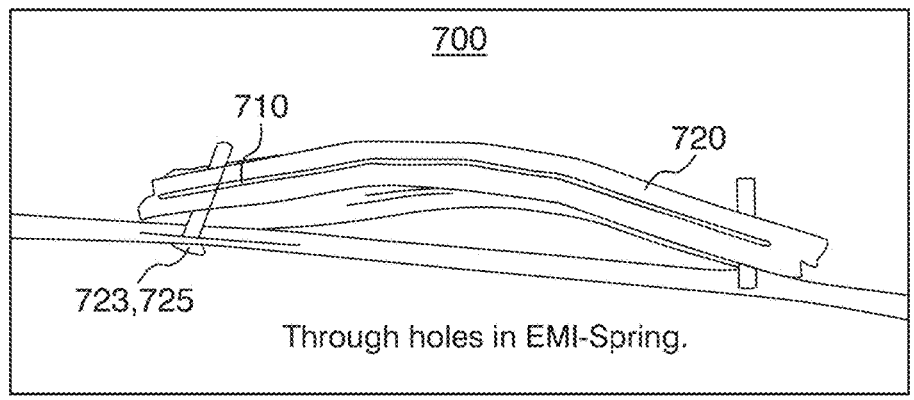
FIG. 7 shows screws passing through eyelets in a shielding structure.

FIG. 7 shows screws 725 passing through eyelets or through-holes 723 in a shielding structure 700. In this embodiment, the shielding structure 700 is for laterally surrounding an electronic component. One or more eyelets or through-holes 723 may be formed in the core or EMI shielding material 720. The eyelets 723 may be formed in the EMI material 720, core 710, or both. By forming the eyelets 723 in the core 710, the shielding structure 700 may be compact or the spring part of the shielding structure may make better contact with screws 725 and be rigidly held to the board or a stiffening element. By forming the eyelets only in the EMI material, the structural integrity of the core may be preserved. Through holes in the EMI-shielding structure may be located in the same location as a thermal solution mounting holes positions or other holes present on a PCB.

More details and aspects are mentioned in connection with the embodiments described above or below. The example shown in FIG. 7 may comprise one or more optional additional features corresponding to one or more aspects mentioned in connection with the proposed concept or one or more examples described above or below.

Figure 8:
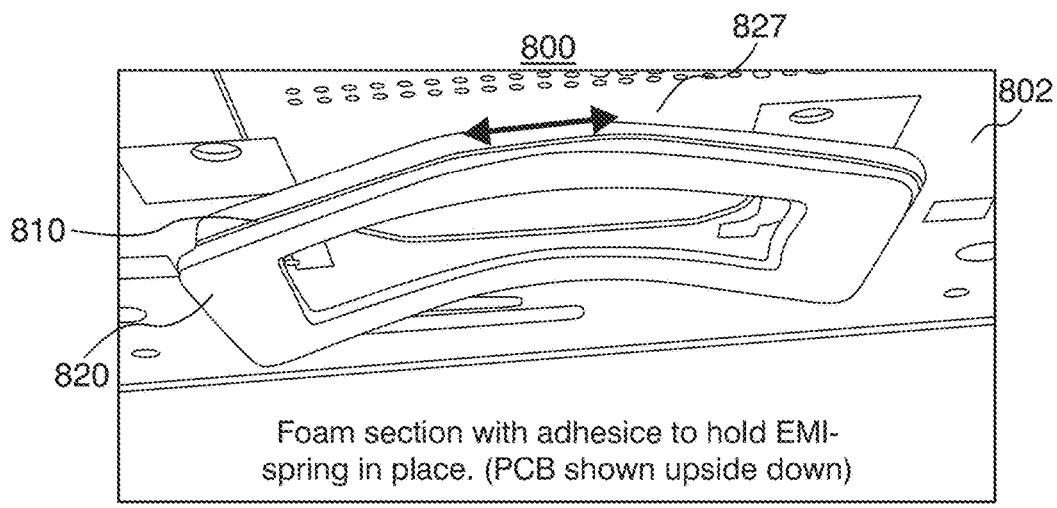
FIG. 8 shows that the shielding structure may be locked to another object with double-sided adhesive.

FIG. 8 shows that the shielding structure 800 may be locked to another object such as the circuit board 802 or a stiffening element with double-sided adhesive 827. In this figure, the shielding structure 800 is shown upside down to demonstrate the adhesion to the PCB 802 without the need for a screw or bolt. For example, an adhesive may be between the shielding structure and the PCB or thermal solution. This may hold in place the shielding structure while the thermal solution is fully attached to the PCB mounting mechanism. Locking the shielding structure 800 with adhesive may make it easier to add compression to the core 810 and EMI material 820 in the assembly of an electronic device.

More details and aspects are mentioned in connection with the embodiments described above or below. The example shown in FIG. 8 may comprise one or more optional additional features corresponding to one or more aspects mentioned in connection with the proposed concept or one or more examples described above or below.

Figure 9:
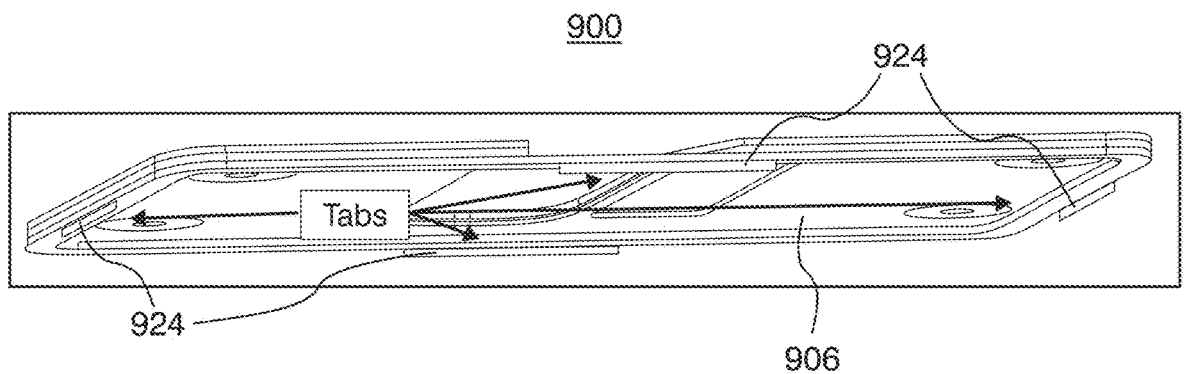
FIG. 9 shows that a stiffening structure may have tabs.

FIG. 9 shows that a stiffening structure 900 may have tabs 929 to restrain the movement of an EMI shielding structure. For example, tabs 929 around a stiffening structure like a heatsink frame may lock the x/y EMI-spring final position.

A substantially or fully attached shielding structure creates the EMI seal between the PCB and the heatsink frame. The thickness of the structure, and in particular the EMI shielding material, may be designed to enclose a package when the shielding structure is attached. Tabs, adhesives, fasteners, and another attachment mechanism may enable a thermal solution attachment mechanism to use an integrated EMI feature of the shielding structure.

More details and aspects are mentioned in connection with the embodiments described above or below. The example shown in FIG. 9 may comprise one or more optional additional features corresponding to one or more aspects mentioned in connection with the proposed concept or one or more examples described above or below.

Figure 10A:
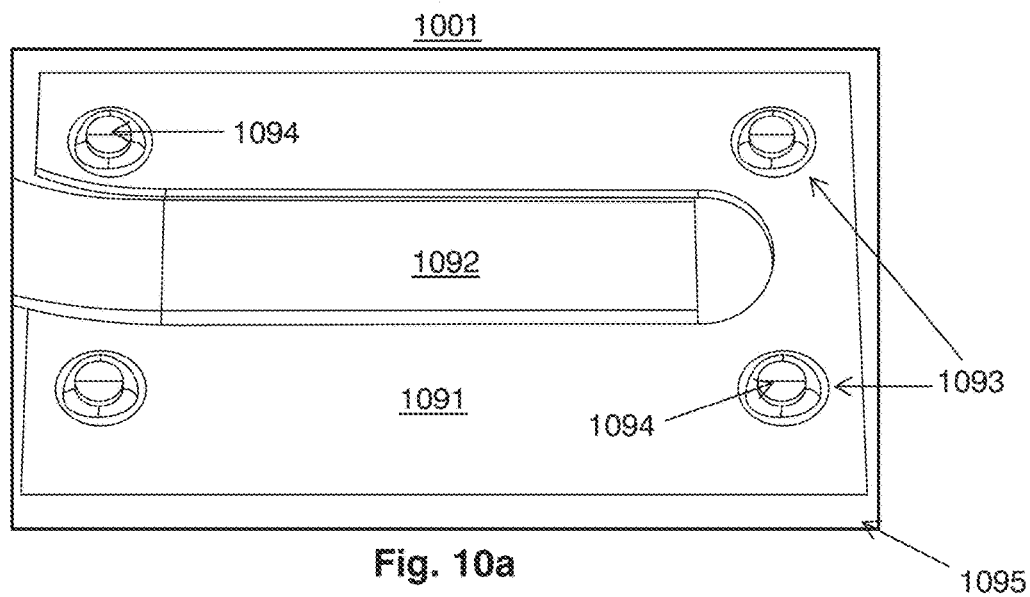
FIGS. 10A to 10C show a simulation to validate the shielding structure concept.
Figure 10B:
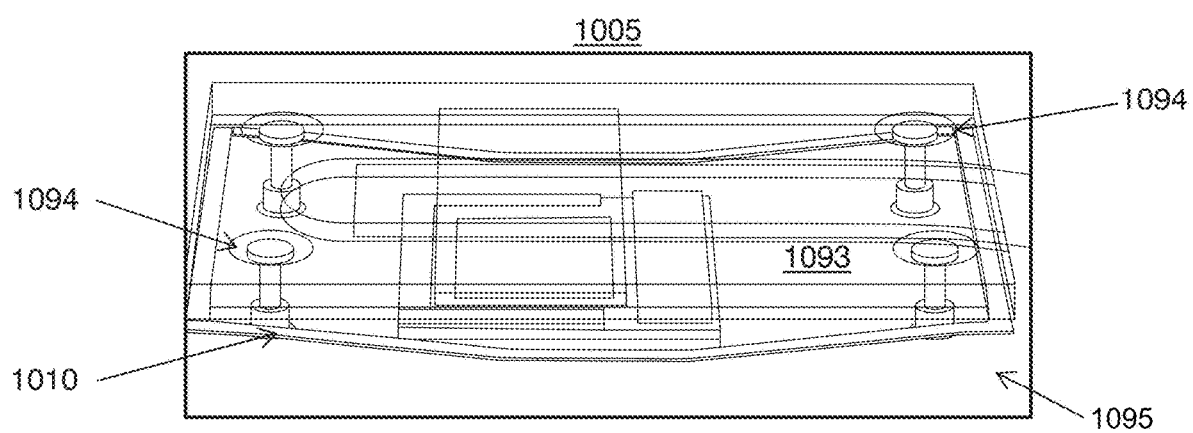
Figure 10C:
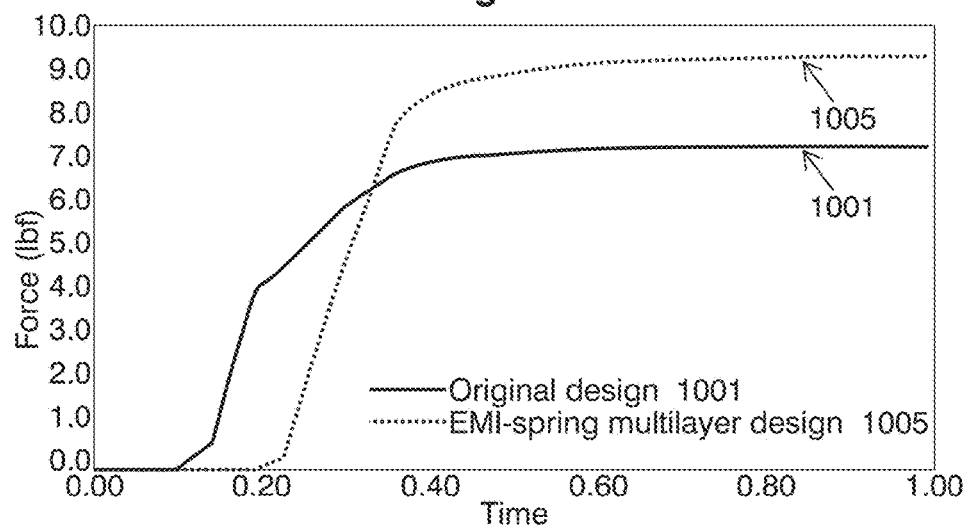

FIGS. 10A to 10C show a simulation to validate the shielding structure concept when combined with a thermal solution with a heat pipe 1092 and an aluminum frame 1093. FIG. 10A shows an original design 1001 with spring-washers 1093 sitting in a frame cavity. In this design, only an EMI foam is located between the frame and the board. The load mechanisms are spring-washers 1093 between the screws 1094 and the frame. FIG. 10B shows a second design 1005 with an EMI shielding structure 1010 as a multilayer system that lays between the frame 1093 and the motherboard 1095. In this design 1005, the washer-spring is changed to an EMI shielding solution 1010 located at the same perimeter location of the foam as in the original design 1001. Only screws 1094 are used in this embodiment. The aluminum frame 1091 in FIG. 10B is shown as a transparent part.

FIG. 10C shows a summary of a transient load attachment simulation. Reference 1001 is the original design (FIG. 10 A). Reference 1005 is the simulation using the shielding structure solution (FIG. 10B). The only change between both designs is the load mechanism and how the EMI foam is used. The new design is capable of increasing the load by approximately 2 lbf. In general, at higher load pressure the heat transfer will increase.

Figure 11B:
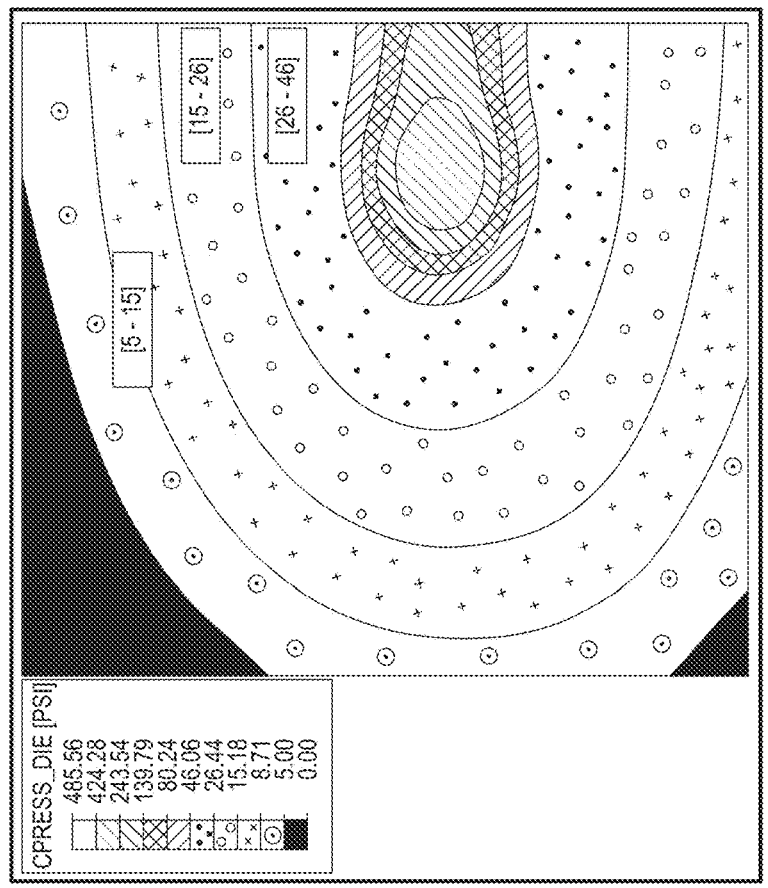
FIGS. 11A and 11B show the pressure distribution of the simulation of FIGS. 10A and 10B.
Figure 11A:
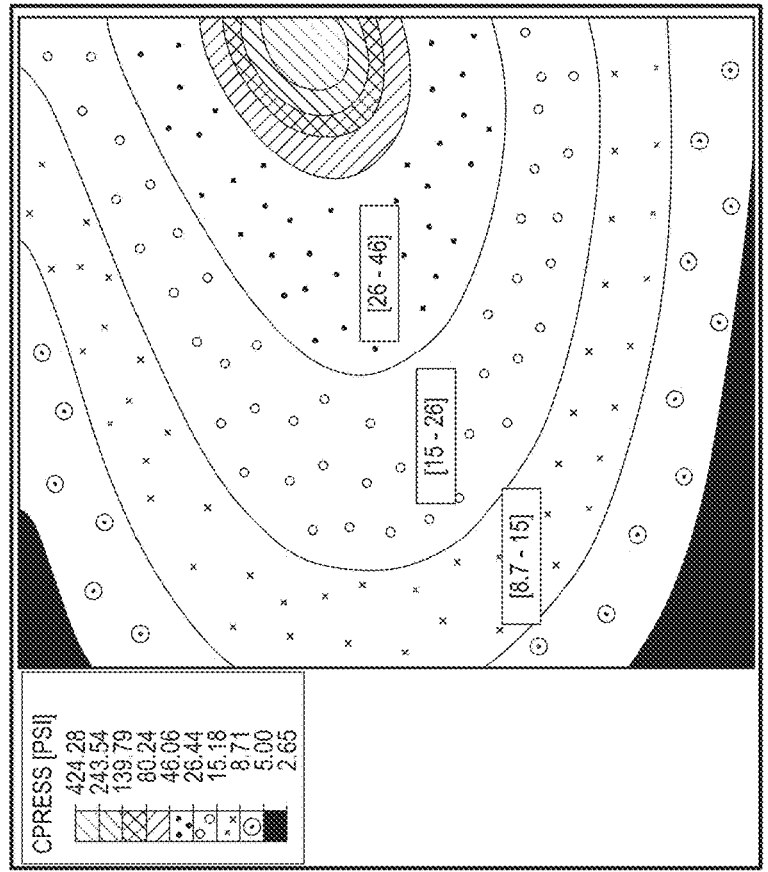

FIGS. 11A and 11B show the pressure distribution of the simulation of FIGS. 10A and 10B. FIG. 11A shows pressure distribution over the die in the original design. In the original design, the pressure concentration is near the die's right edge. FIG. 11B shows pressure distribution over the EMI-spring multilayer system design. In this figure, the EMI-spring multilayer system design has the high-pressure spot nearest the die center. This result is desirable as die hot spot locations are close to the die center. The position improvement of the high-pressure spot is due to lower frame deformation since the EMI-spring multilayer system around the perimeter of the frame limits the frame's deformation.

Figure 12A:
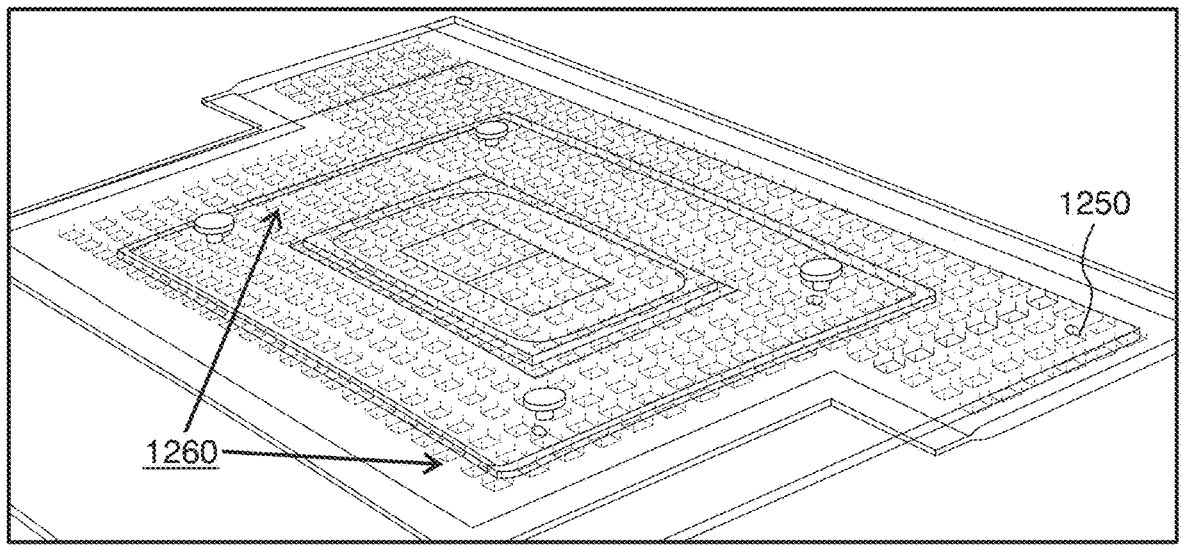
FIGS. 12A to 12C show a second simulation to validate the shielding structure concept.
Figure 12B:
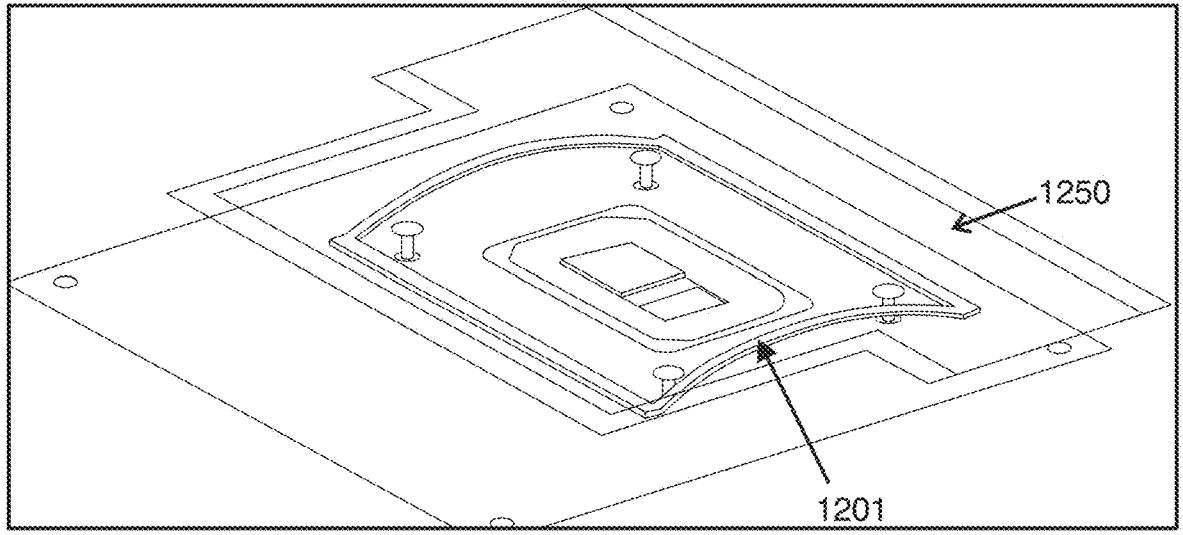
Figure 12C:
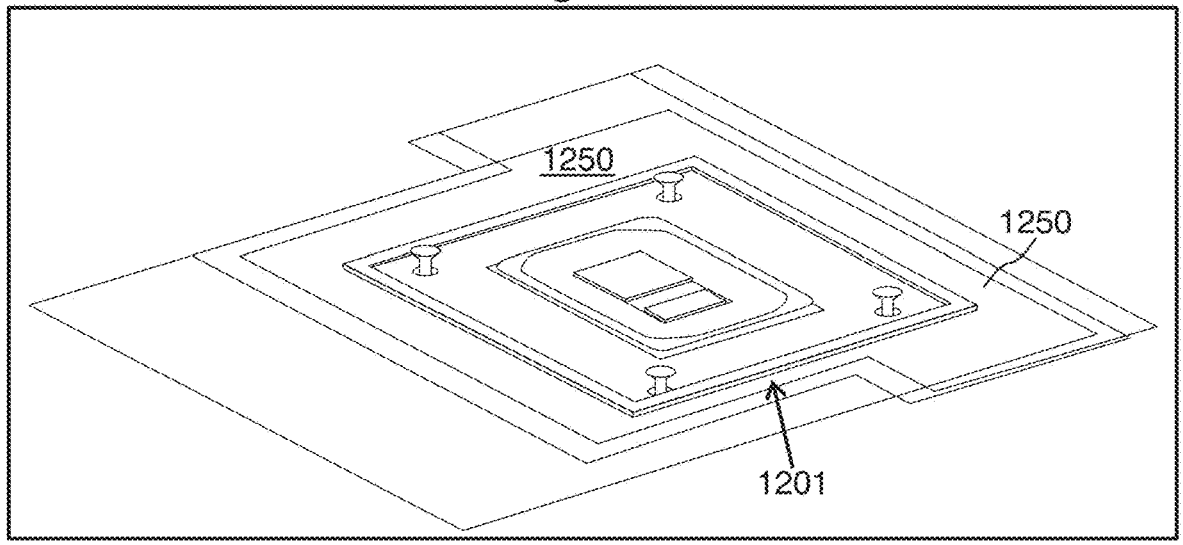

FIGS. 12A to 12C show a simulation to validate the shielding structure concept when combined with a thermal solution with a vaper chamber 1250. FIG. 12A shows a design only with a vapor chamber 1250 and an EMI gasket perimeter 1260. FIG. 12B shows a vapor chamber 1250 with an EMI shielding structure 1201 in a non-attached initial position. FIG. 12C shows the vapor chamber 1250 with the EMI shielding structure 1201 in an attached final position (compressed, deformed).

Figure 13A:
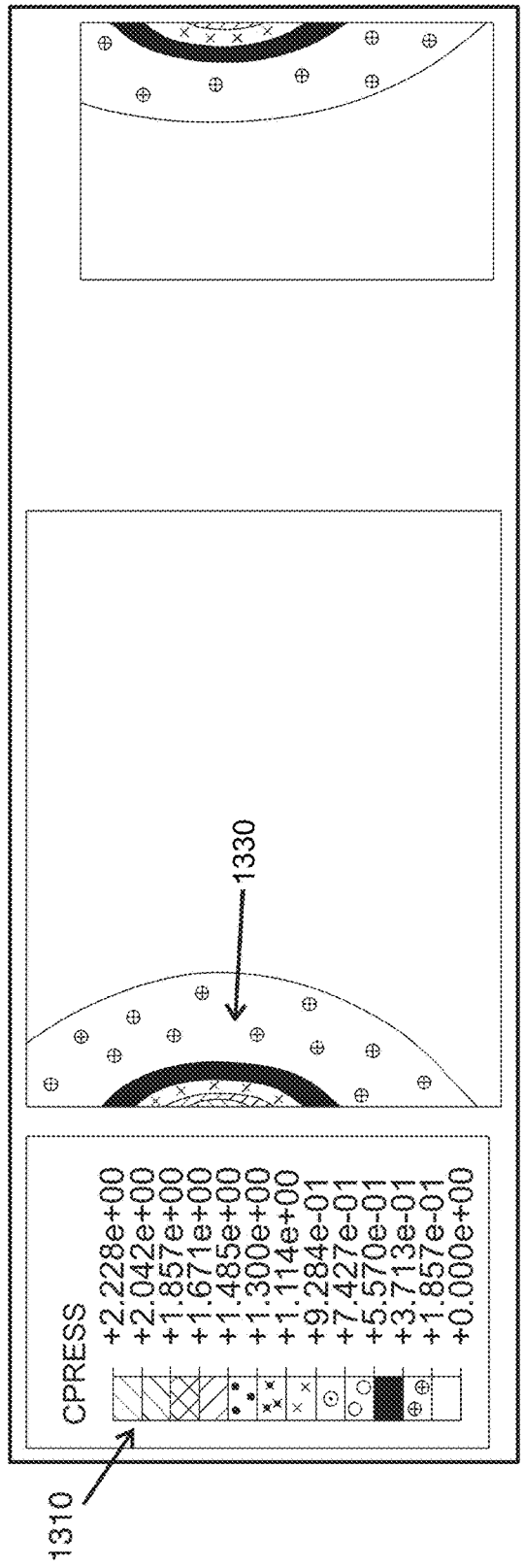
FIGS. 13A and 13B show a summary of a transient load attachment simulation of FIGS. 12A and 12B.
Figure 13B:
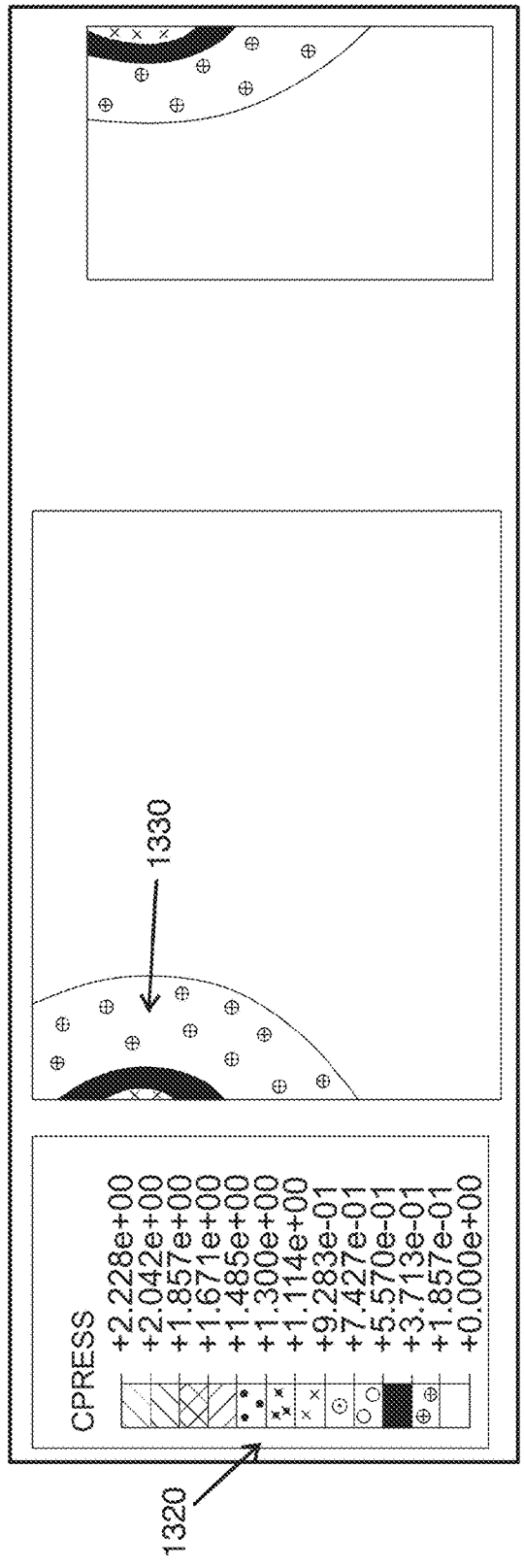

FIGS. 13A and 13B shows a summary of a transient load attachment simulation of FIGS. 12A and 12B. FIG. 13A shows a peak pressure with the EMI gasket solution of FIG. 12A. Whereas FIG. 13B shows a die peak pressure reduction with the vapor chamber design using the EMI-spring multilayer solution of FIG. 12B. Results of the simulation show that peak pressure reduces with 'EMI-Spring' from 2.23 MPa 1310 to 1.35 MPa (40% less) 1320 at die edge 1330, reducing die crack risk.

Figure 14:
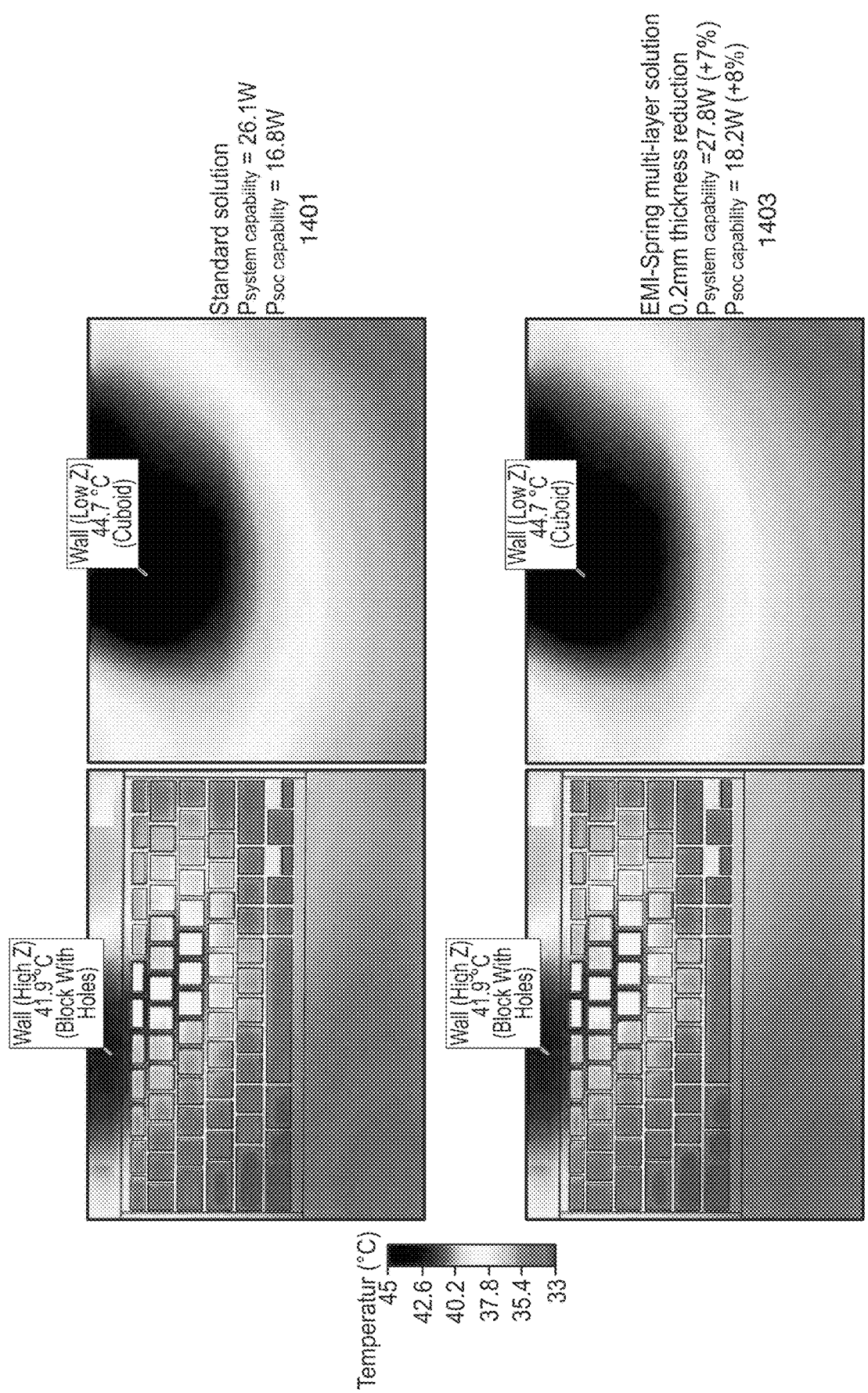
FIG. 14 shows a comparison between two cases of a case study.

A case study with three designs was developed to determine a thermal performance improvement using the deformable EMI shielding structure. In it, case 1 1401 included a 1.2 mm thick heatsink frame thermal solution with a baseline air gap. Case 2 1402 decreased the heatsink frame's thickness to 1.0 mm thick thermal solution to enable a +0.2 mm system air gap. Case 3 1403 included the EMI shielding structure using a 1.0 mm thick heatsink frame thermal solution increasing +0.2 air gap. FIG. 14 shows a comparison between case 1 and case 3, where the EMI shielding structure showed a thermal benefit. The design enabled an increase in the air gap which reduced the T-skin temperature by 7% compared to case 1. System capability increased from 26.1 W to 27.8 W.

Figure 15:
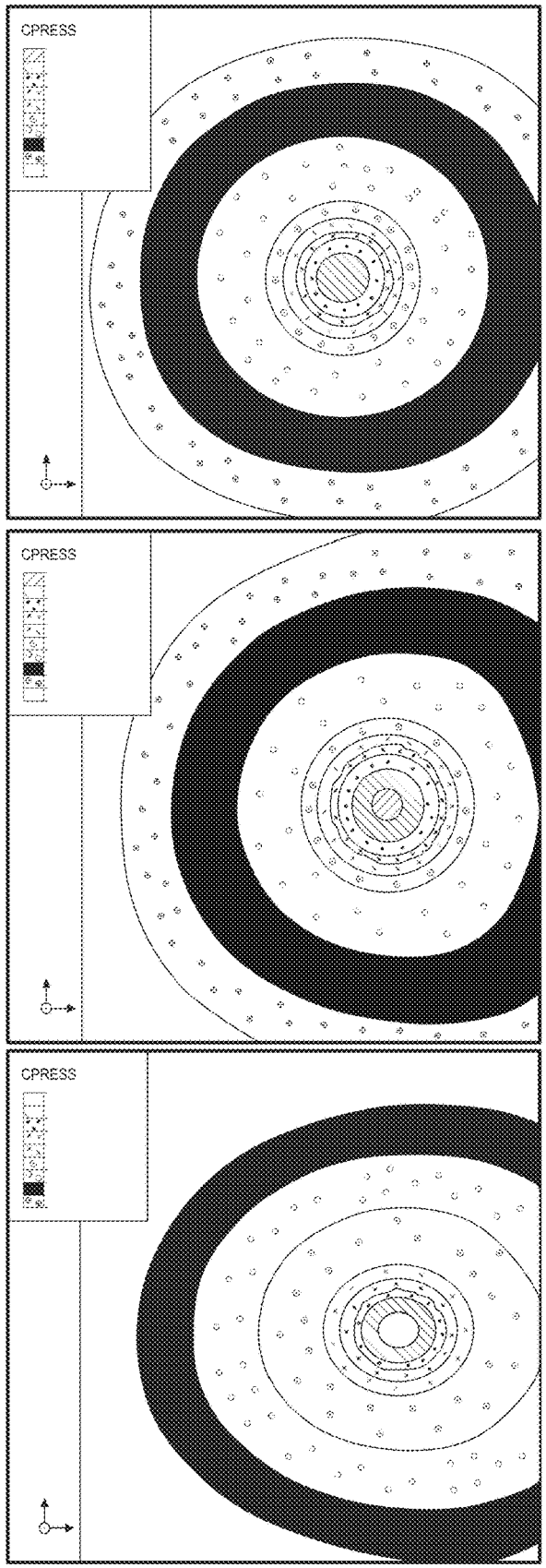
FIG. 15 shows a comparison of pressure maps comparison between three cases.

FIG. 15 shows a comparison of pressure maps comparison between the three cases. In it, the EMI shielding structure shows a structural benefit. Case 2 1502 has a heatsink frame's thickness equal to 1.0 mm verses. the heatsink frame used in case 1 (1.2 mm) 1501. Case 2 1502 increases the peak pressure from 575 psi to 957 psi (die crack specification limit is 800 psi). However, case 3 1503 with the EMI shielding structure reduces the peak pressure to an acceptable 638 psi compared to case 2 1502. In this case study, the EMI shielding structure enables more system capacity by 7% because the die crack risk is not a concern.

FIG. 16 shows data collected from a thermal reference solution. Thermal greases (TIMs) are commonly used in mobile systems. The effect of a 2 lbf difference in pressure may depend on the die size and the final load generated by the thermal solution over the die. For a small die, a 2 lbf difference could significantly increase the average pressure over the die. Small form factors are often limited by the z-thickness height with a low die load (between 5 lbf to 7 lbf). So 2 lbf may be a significant load difference in these form factors.

An impedance analysis of the thermal solution below and above 7 lbf under 50 um bond line thickness (BLT) was conducted. Reference 1601 on the left shows a load between 6.5 lbf and 7.0 lbf. Reference 1605 on the right shows a load between 7.1 lbf and 8.5 lbf. The impedance showed a statistical difference once the die load was above 7 lbf compared to below 7 lbf. In both cases, the TIM's BLT was under 50 um (nominal value). FIG. 16 shows a thermal impedance $\Psi_{j\text{-}hp}$ ($Psi_{j\text{-}hp}$) reduction by increasing nominal load by 1-2 lb. Thus a thermal solution employing the shielding structure (EMI-spring solution) may reduce the thermal resistance of thermal greases (TIMs) and increase thermal performance due to an increase in the average pressure on a die or other electronic component (e.g. an additional 2 lbf).

Figure 17:
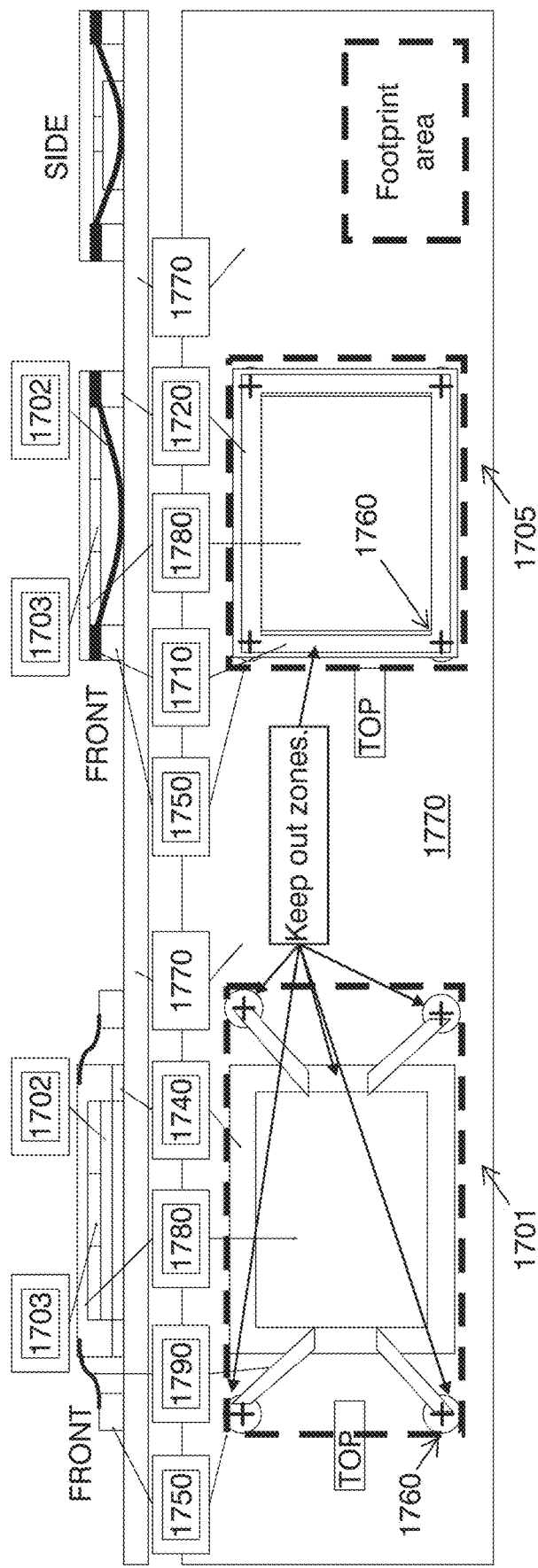
FIG. 17 shows a footprint area reduction when using the EMI shielding structure.

FIG. 17 shows a footprint area reduction when using the EMI shielding structure. The figure shows a "study" case. The case shows how the shielding structure optimizes a thermal solution's footprint. The design using the EMI shielding structure 1705 moves the mounting holes from the outside of the heatsink frame footprint to inside the heatsink perimeter.

The shielding structure 1705 may partially or completely, laterally surround the electrical component (e.g. package 1702 or die 1703). For example, shielding structure 1710 may completely encircle the electrical component 1702 on the circuit board. Alternatively, the shielding structure may only partially, laterally surround the electrical component. For example, the shielding structure may encircle the electrical component along at least 50% (or at least 70% or at least 90%) of a circumference of the electrical component. For example, the shielding structure may completely encircle the electrical component except for an opening for a structure (e.g. cooling structure) extending into a cavity enclosed by the circuit board, the shielding structure, and the lid.

The shielding structure 1705 may only partially enclose a component to allow access to the internals for specific purposes, such as heat dissipation through a heat pipe. By leaving a portion of the component exposed, it may help more efficiently transfer thermal energy to an external cooling system. A partial enclosure may also afford accessibility for connectors, mechanical components (e.g. buttons or switches), modularity for sub-components, and/or signal transmission. For example, a shielding structure may have gaps or slots to enable the transmission of specific signals, such as wireless or RF signals, while still providing partial electromagnetic shielding to protect sensitive internal circuitry.

In FIG. 17 at the left, there is a standard thermal solution 1701 with a standard EMI shield 1740. It uses leaf springs 1790 to generate the compression load. On the right, there is a shielding structure (EMI-spring design) comprising a core 1710 and an EMI shielding material 1720. In the EMI-spring design 1705, the screws 1760 (represented by crosses) are over the frame 1780. They attach the thermal solution's heatsink frame against the board 1770. The EMI shielding structure is in between the frame and the board.

FIG. 17 shows how the shielding structure 1705 may optimize the thermal solution's footprint. The design using the EMI-spring moves the mounting holes 1750 from the outside of the heatsink frame footprint to inside the heatsink perimeter. In other words, the mounting holes of the shielding structure could be located inside the solution footprint. This may allow for a thermal solution footprint reduction. It minimizes required keep-out zones in the motherboards.

The EMI-spring design may reduce the area necessary to attach the thermal solution compared to the standard solution. For this reason, there is a footprint reduction. Table 1 shows a comparison between a standard solution and the EMI shielding structure design.

TABLE 1

| Features | Standard solution | EMI-Spring design |
|---|---|---|
| Mounting holes' location | Outside the heatsink frame's perimeter footprint. | Inside the heatsink frame's perimeter footprint. |
| Springs | Outside the heatsink frame's perimeter footprint. To avoid any contact with the springs components' height below the spring should be restricted. | Inside the heatsink frame's perimeter footprint. Components' height is unrestricted outside the heatsink frame's perimeter. |

More details and aspects are mentioned in connection with the embodiments described above or below. The examples shown in FIG. 17 may comprise one or more optional additional features corresponding to one or more aspects mentioned in connection with the proposed concept or one or more examples described above or below.

Figure 18A:
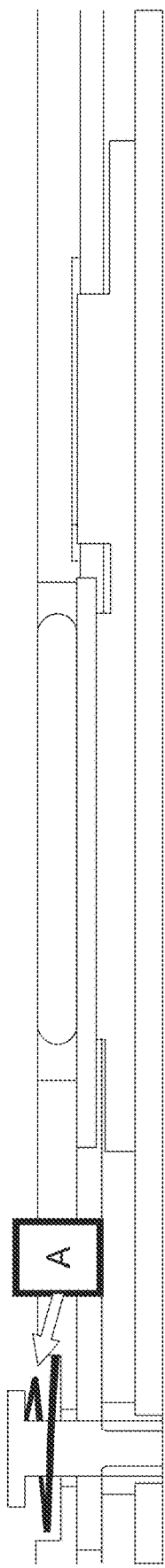
FIGS. 18A and 18B show an example of how the shielding structure may optimize the height or total Z-stack of the electronic system.
Figure 18B:
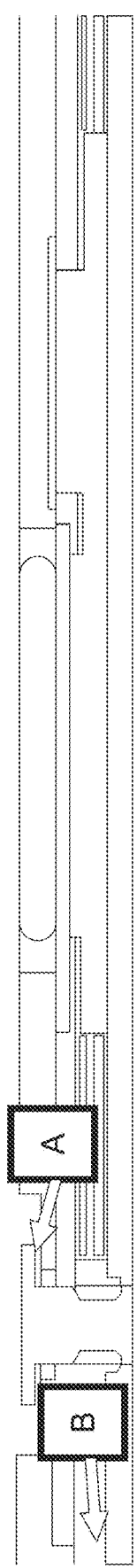

FIGS. 18A and 18B show an example of how the shielding structure may optimize the height or total Z-stack of the electronic system. The shielding solution design may allow for simplification as springs (conical, compression) can be eliminated since the EMI-spring structure will be enough to control loading. FIG. 18A shows a cross-section view of an attached mechanism load system using a conical spring. As shown by reference A, the screw tip does not sit flush with the frame because of the solid length of the conical spring. FIG. 18B shows a cross-section view of an attached mechanism load system using the EMI-spring system. As shown by reference A, the screw tip sits flush with the frame. As shown by reference B, the compressed EMI-spring system is acting as a spring.

The total z-stack of FIG. 18B from the top of the board to the top of the frame in the example is 2.765 mm. This value is lower by 0.8 mm compared to the conical spring solution in FIG. 18A. Table 2 shows observed measurements from the examples of FIGS. 18A and 18B.

TABLE 2

| | Conical spring solution | | | EMI-spring multilayer solution | |
|---|---|---|---|---|---|
| # | Loop Component | Thickness (mm) | # | Loop Component | Thickness (mm) |
| 1 | SLI | 0.2 | 1 | SLI | 0.2 |
| 2 | Substrate | 0.6 | 2 | Substrate | 0.6 |
| 3 | Die Thickness | 0.315 | 3 | Die Thickness | 0.315 |
| 4 | TIM | 0.05 | 4 | TIM | 0.05 |
| 5 | Cold Plate + Solder | 0.6 | 5 | Cold Plate + Solder | 0.6 |
| 6 | Frame – Screw cavity | 0.5 | 6 | Frame – Screw cavity | 0.5 |
| 7 | Solid Spring | 0.8 | 7 | Screw head | 0.5 |
| 8 | Screw head | 0.5 | | | |
| | Total Z-stack | 3.565 mm | | Total Z-stack | 2.765 mm |

A width of the shielding structure may be 5 millimeters (or at least 4 mm, or at least 2.5 mm, or at least 1.5 mm, or at least 1 mm). A height of the shielding structure may be 5 mm (or at least 4 mm, or at least 2.5 mm, or at least 1.5 mm, or at least 1 mm). Various widths or heights of shielding structure within an electronic device offers may allow for tailored EMI shielding. Tailored design may efficiently block interference across a range of frequencies and wavelengths. Additionally, this customization may improve space utilization and minimize material usage, contributing to cost-effectiveness and ensuring the efficient operation of electronic components.

More details and aspects are mentioned in connection with the embodiments described above or below. The examples shown in FIGS. 18A and 18B may comprise one or more optional additional features corresponding to one or more aspects mentioned in connection with the proposed concept or one or more examples described above or below.

Figure 21A:
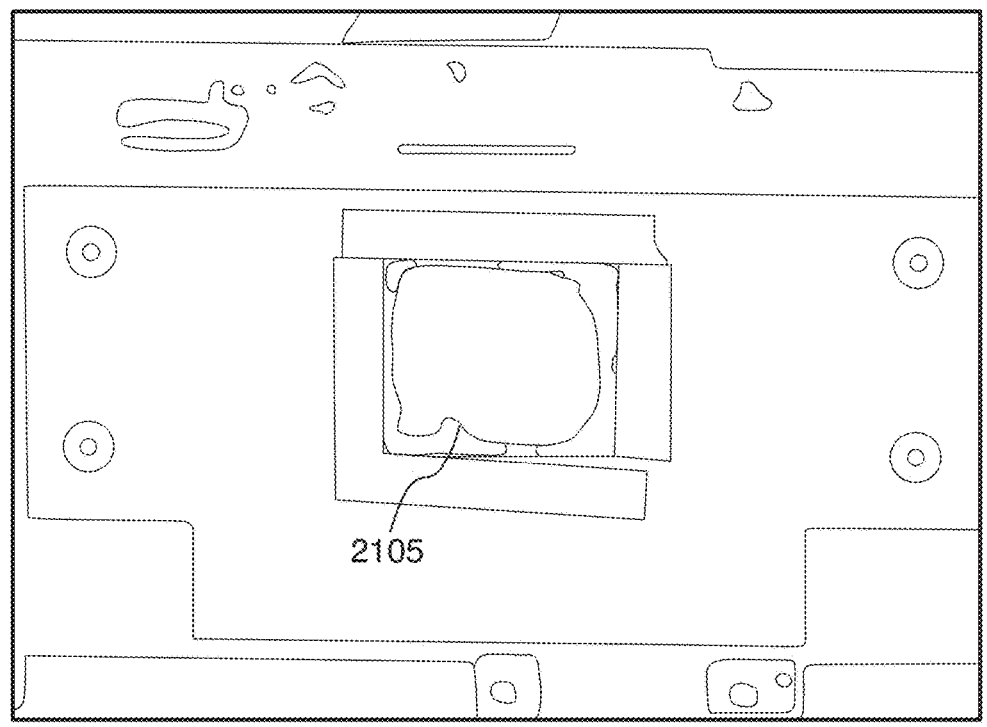
FIG. 21A shows an EMI surrounding a die.
Figure 21B:
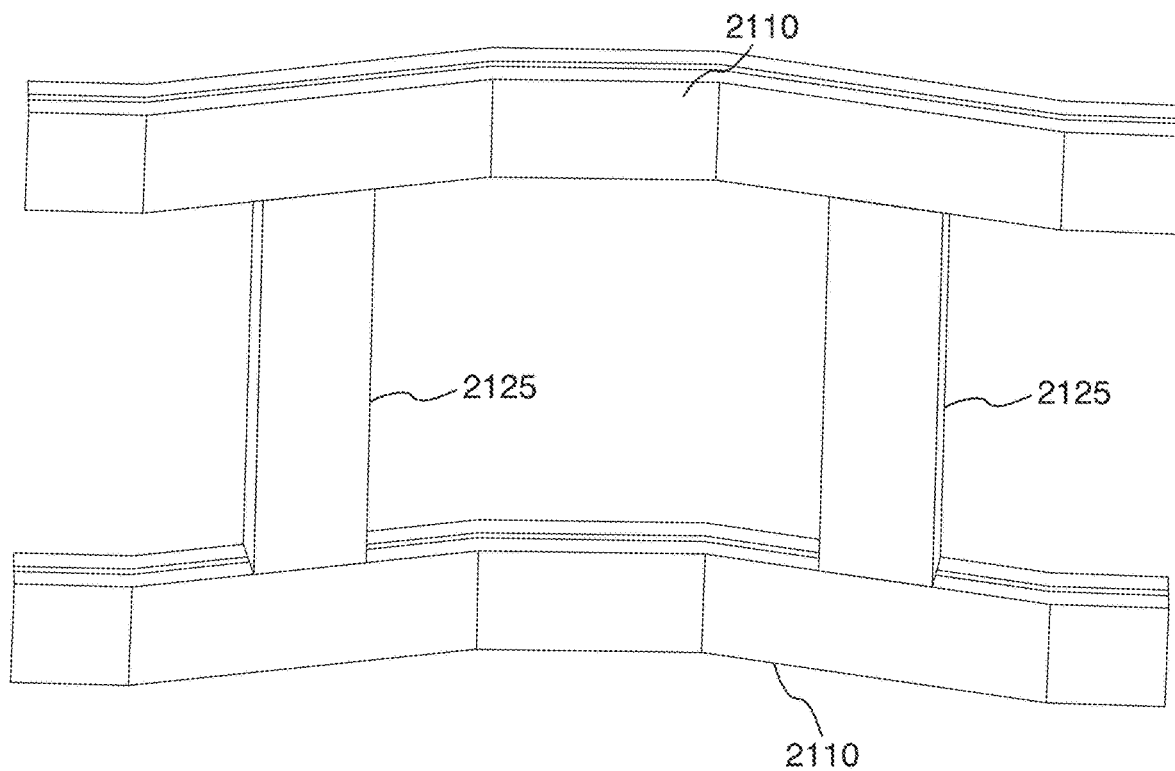
FIG. 21B shows an EMI-spring multilayer for FIG. 21A.

The shielding structure may be adapted and extended to complex designs. FIG. 19A shows an irregular EMI area. FIG. 19B shows an EMI-spring multilayer for the irregular EMI area with a concave shape. In this embodiment, the structure has two cores covered in an EMI material joined to further coreless EMI material. FIG. 20A shows an asymmetric hole position 2023. FIG. 20B shows an EMI-spring multilayer for asymmetric hole positions with a convex shape. Like the previous embodiment, the structure has two cores covered in an EMI material joined to further coreless EMI material. FIG. 21A shows an EMI surrounding a die. FIG. 21B shows an EMI-spring multilayer with EMI surrounding the die with a convex shape. In this embodiment, the two cores 2110 covered in an EMI material are joined by coreless EMI material 2125 in a ladder shape to securely surround the die component 2105.

More details and aspects are mentioned in connection with the embodiments described above or below. The examples shown in FIGS. 19A to 21B may comprise one or more optional additional features corresponding to one or more aspects mentioned in connection with the proposed concept or one or more examples described above or below.

The convex and the concave positions may make it possible to influence the final deformation of the thermal solution by installing the design in a convex or concave position. This may improve the pressure map over the die. The EMI-Spring multilayer may support the thermal solution frame or vapor chamber from below and minimize the frame deformation while creating the EMI shielding around the components of the electronic package.

The shielding structure may be part of an electronic device where the structure may at least partially, laterally surround an electrical component on a circuit board. A stiffening structure may then be arranged atop the shielding structure to apply a compressive force to the shielding structure when affixed to the circuit board. Arranging a stiffening structure, such as a thermal solution, atop the shielding structure may enable the spring force of the shielding structure to improve the proper mechanical contact of the stiffening structure to other components contained in the electronic device. For example, when the stiffening structure is a thermal solution the shielding structure may promote optimal thermal performance and component reliability in the electronic package.

The PCB may be a rigid or flexible board comprising non-conductive material (e.g. fiberglass or epoxy) with conductive pathways etched, disposed, and/or printed onto its surface. It may serve as a platform for assembling and interconnecting electrical components, enabling the flow of electrical signals and power between them to form a functional electronic system or device. A thickness of the circuit board may be at least 0.5 millimeters (or at least 0.1 mm, at least 0.25 mm, at least 1 mm) and/or at most 2 mm (or at most 1 mm, at most 0.7 mm, or at most 0.5 mm).

A stiffening structure may be a lid, a thermal solution, or any component that may aid in the rigid compression of the shielding structure. For example, a lid may be such as an EMI lid or a protective lid crafted from rigid or semi-rigid materials such as metal or other electrically conductive materials It may assume a primary role in enveloping and safeguarding the delicate internal components of the device. A lid may be attached with a thermal solution to underlying components. A thickness of the lid 110 may be 0.10 millimeters (or at least 0.05 mm, or at least 0.25 mm, or at least 0.15 mm, or at least 0.1) and/or at most 0.2 millimeters (or at most 0.01, or at most 0.15, or at most 0.45, or at most 1 mm). The lid may provide structural integrity and act as a barrier against external impacts, dust, or moisture and/or may avoid or reduce electromagnetic interference. A lid may incorporate thermal management features, including vents, which aid in the efficient dissipation of heat generated by a processor during operation. The lid may extend over the electrical component. For example, the electrical component is arranged between the lid and the circuit board.

A lid may be affixed to the shielding structure using snap-fit connections, interlocking tabs or grooves, threaded fasteners, adhesive bonding, and/or any combination of these methods. Supporting the lid with the shielding structure allows for the lid to be used as a stiffener within the component stack. A diagram of the proposed solution. When the lid 100 is affixed to the circuit board 104 (e.g. attached by screws to the stack), the lid may carry membrane loads during bending since it is connected to the shielding structure (e.g. fence). This may be further enhanced when the connection to the structure is rigid (e.g. affixed with stiff corners and snaps).

For example, the thermal solution may be a component or system designed to dissipate heat from an object or an environment, thereby reducing its temperature and maintaining thermal balance. It may provide a pathway for transferring heat away from the heat source and dispersing it into the surrounding environment. The thermal solution or cooling structure may be or may comprise a heat pipe, a heat exchanger, a liquid cooling system, a heat sink, a vapor chamber, and/or a cold plate. Arranging a thermal solution atop a shielding structure may distribute load forces evenly across the thermal solution allowing it to make better contact with a heat source, such as a processor. This may enhance heat dissipation and temperature regulation, improving the overall thermal performance and reliability of the electronic device.

The cooling structure may extend from the top of the electrical component through an opening in the shielding structure or between the shielding structure and the lid. Extending a cooling structure through an opening in the shielding structure may allow for enhanced cooling of specific components or areas within the electronic package while maintaining the necessary electromagnetic shielding for sensitive components.

For example, additional cooling structures, devices, and/or components may be arranged outside the shielding structure and connected via a heat pipe or similar element. This may allow the use of a larger or better-located cooling structure than may be possible or desired if it were completely enclosed by the lid and shielding structure. Connecting the cooling structure 150 through an opening in the shielding structure may also allow for a reduced height or thickness of the electronic device by reducing the necessary height of the components shielded by the structure and lid.

The shielding structure may include an eyelet and the stiffening structure may be affixed to the circuit board with a fastener passing through the eyelet. The fastener may be a screw, a bolt, or a rivet. The fastener may be a device or component used to securely join or hold together two or more objects. It is designed to provide mechanical strength and stability to the assembly by creating a reliable and durable connection. Fasteners come in various forms, such as screws, bolts, rivets, and/or clips. They also may be made from materials like metal, plastic, and/or composite materials. The fastener may feature a threaded or grooved structure that allows it to be easily inserted, tightened, and/or secured in place. For example, fasteners play a critical role in the assembly of electronic devices, ensuring the structural integrity and reliability of the components and allowing for efficient maintenance and repair when necessary. The fastener may attach the stiffening structure to the shielding structure to reuse existing holes or already present on the circuit board.

The circuit board may include a groove adapted to the core of the shielding structure. Adding a groove to the circuit board may allow the shielding structure to remain in place when compression is added without affixing the shielding structure to the board with a fastener. This may allow the tension added to the stack with compression to hold the shielding structure in place, simplifying assembly and reducing cost. Furthermore, a groove could allow for the EMI shielding material to only cover one side (e.g. a top side) of the core. This may reduce the need for the necessary EMI shielding provided that core resting in a groove of the PCB board does not require additional shielding on a bottom side of the core.

The electrical component may be one or more of a processor, a memory device, an integrated circuit, a transistor, and/or a power supply unit. The electrical component may refer to discrete devices, integrated circuits (ICs), and/or semiconductor components that contribute to the operation and functionality of an electronic device or system. For example, the electrical component may be a processor (e.g. CPU, GPU, XPU, microcontroller, and/or digital signal processor), a memory, or a transceiver. These components, which are often found on a circuit board, enable the processing, storage, and/or manipulation of electrical signals and data within an electronic device. Moreover, using the lid as a stiffening component may decrease the mechanical failure risk of a CPU and other core area components.

The electrical component and shielding structure may be arranged between the circuit board and a lid. Arranging the electrical component and shielding structure in this manner may improve the EMI shielding of the structure.

Figure 22:
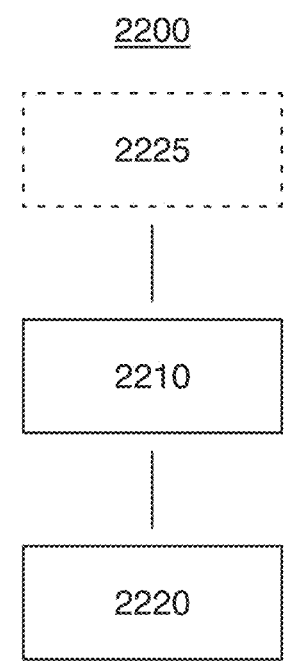
FIG. 22 shows a flowchart of a method for producing a shielding structure for an electronic component.

FIG. 22 shows a flowchart of a method 2200 for producing a shielding structure for an electronic component. The method includes forming a core 2210 comprising an elastic material, wherein the core includes at least a spring part comprising one or more arches. The method also includes covering 2229 at least a part of the core in an EMI shielding material. To create the shielding structure, an EMI foam may be bonded above, below, or on both sides of a preformed spring (metallic or any other elastic material).

The method may further include covering the core in an EMI shielding material comprises layering a first portion of the EMI shielding material beneath the core and layering a second portion of the EMI shielding material atop the core.

Figure 23:
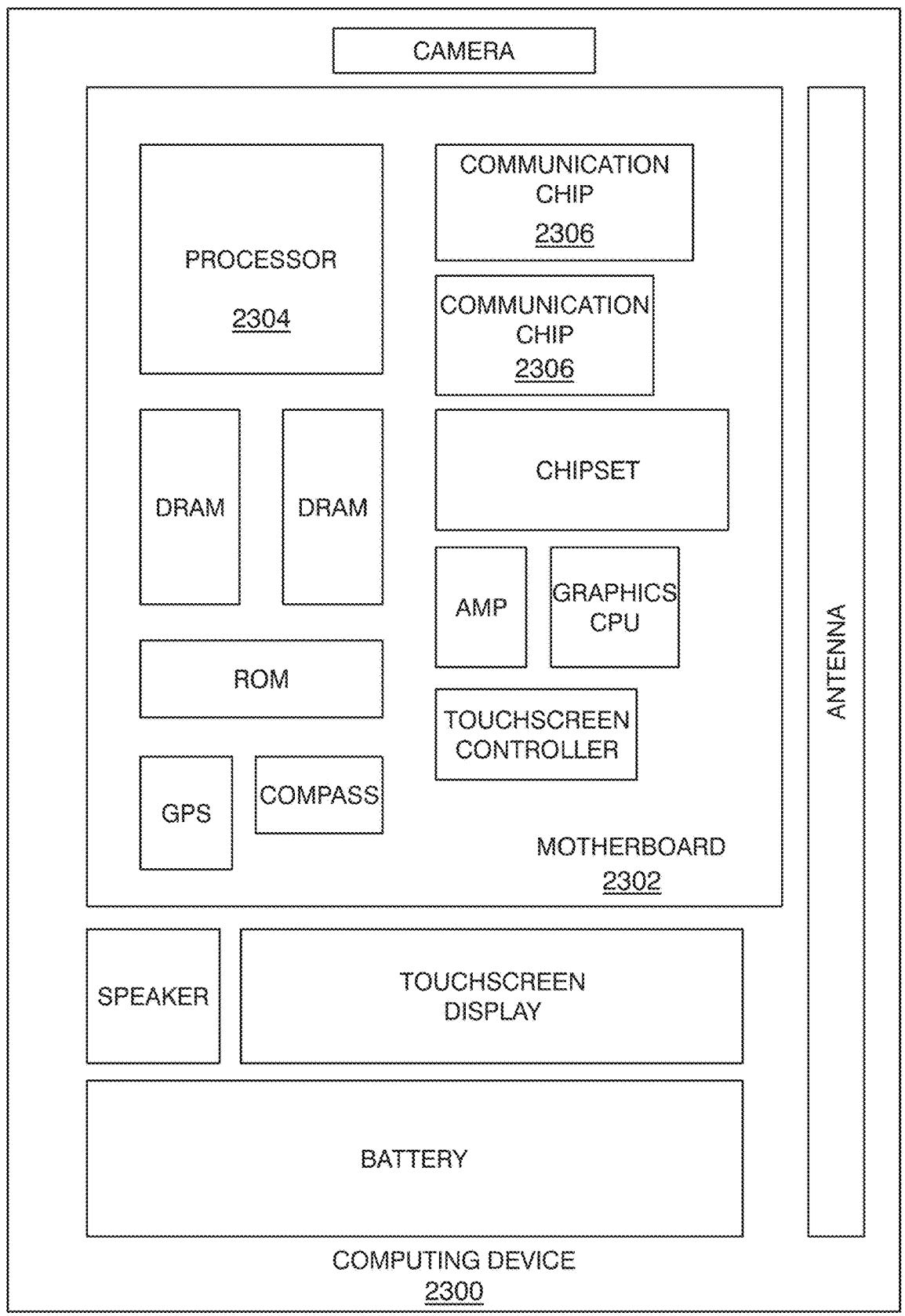
FIG. 23 illustrates a computing device in accordance with one implementation of the shielding structure.

FIG. 23 illustrates a computing device 2300 in accordance with one implementation of the shielding structure. The computing device 2300 houses a board 2302. The board 2302 may include a number of components, including but not limited to a processor 2304 and at least one communication chip 2306. The processor 2304 is physically and electrically coupled to the board 2302. In some implementations, at least one communication chip 2306 is also physically and electrically coupled to the board 2302. In further implementations, the communication chip 2306 is part of the processor 2304.

The shielding structure as described above and below may substantially enclose the number of components of the computing device 2300. The shielding structure could be part as part of a system. The shielding structure of the system includes a core comprising an elastic material and at least a spring part of the core comprising an arch. The shielding structure additionally includes an electromagnetic interference (EMI) shielding material affixed to the core. The shielding structure further laterally surrounds a component of the system or computing device 2300.

Depending on its applications, computing device 2300 may include other components that may or may not be physically and electrically coupled to the board 2302. These other components include, but are not limited to, volatile memory (e.g., DRAM), non-volatile memory (e.g., ROM), flash memory, a graphics processor, a digital signal processor, a cryptoprocessor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 2306 enables wireless communications for the transfer of data to and from the computing device 2300. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 2306 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 2300 may include a plurality of communication chips 2306. For instance, a first communication chip 2306 may be dedicated to shorter-range wireless communications such as Wi-Fi and Bluetooth and a second communication chip 2306 may be dedicated to longer-range wireless communications such as GPS, EDGE, GPRS, CDMA, WiMAX, LTE, Ev-DO, and others.

The processor 2304 of the computing device 2300 includes an integrated circuit die packaged within the processor 2304. In some implementations of the device or system, the integrated circuit die of the processor includes one or more devices that are assembled in an ePLB or eWLB-based POP package that includes a mold layer directly contacting a substrate, in accordance with implementations of the device or system. The term "processor" may refer to any device or portion of a device that processes electronic data from registers and/or memory to transform that electronic data into other electronic data that may be stored in registers and/or memory.

The communication chip 2306 also includes an integrated circuit die packaged within the communication chip 2306. In accordance with another implementation of the device or system, the integrated circuit die of the communication chip includes one or more devices that are assembled in an ePLB or eWLB-based POP package that includes a mold layer directly contacting a substrate, in accordance with implementations of the device or system.

Examples may further be or relate to a (computer) program including a program code to execute one or more of the above methods when the program is executed on a computer, processor, or other programmable hardware component. Thus, steps, operations, or processes of different ones of the methods described above may also be executed by programmed computers, processors, or other programmable hardware components. Examples may also cover program storage devices, such as digital data storage media, which are machine-, processor- or computer-readable and encode and/or contain machine-executable, processor-executable, or computer-executable programs and instructions. Program storage devices may include or be digital storage devices, magnetic storage media such as magnetic disks and magnetic tapes, hard disk drives, and/or optically readable digital data storage media, for example. Other examples may also include computers, processors, control units, (field) programmable logic arrays ((F)PLAs), (field) programmable gate arrays ((F)PGAs), graphics processor units (GPU), application-specific integrated circuits (ASICs), integrated circuits (ICs) or system-on-a-chip (SoCs) systems programmed to execute the steps of the methods described above.

It is further understood that the disclosure of several steps, processes, operations, or functions disclosed in the description or claims shall not be construed to imply that these operations are necessarily dependent on the order described unless explicitly stated in the individual case or necessary for technical reasons. Therefore, the previous description does not limit the execution of several steps or functions to a certain order. Furthermore, in further examples, a single step, function, process, or operation may include and/or be broken up into several sub-steps, -functions, -processes, or -operations.

If some aspects have been described in relation to a device or system, these aspects should also be understood as a description of the corresponding method. For example, a block, device, or functional aspect of the device or system may correspond to a feature, such as a method step, of the corresponding method. Accordingly, aspects described in relation to a method shall also be understood as a description of a corresponding block, a corresponding element, a property, or a functional feature of a corresponding device or a corresponding system.

An example (e.g. example 1) relates to a shielding structure for an electronic component, the shielding structure comprising a core comprising an elastic material and at least a spring part of the core comprising an arch, and an electromagnetic interference (EMI) shielding material affixed to the core.

Another example (e.g. example 2) relates to a previously described example (e.g. example 1), further comprising, wherein the core is wire-shaped or ribbon-shaped.

Another example (e.g. example 3) relates to a previously described example (e.g. one of the examples 1 or 2), wherein, the spring part elastically deforms towards a deformable state shape (a flat shape) when subjected to a compressive force.

Another example (e.g. example 4) relates to a previously described example (e.g. one of the examples 1 to 3), wherein the arch comprises at least one of: a segmental arch, a round arch, a triangular arch, or a trapezoidal arch.

Another example (e.g. example 5) relates to a previously described example (e.g. one of the examples 1 to 4), wherein the EMI shielding material is a compressible material.

Another example (e.g. example 6) relates to a previously described example (e.g. one of the examples 1 to 5), wherein the EMI shielding material is electrically conductive.

Another example (e.g. example 7) relates to a previously described example (e.g. one of the examples 1 to 6), wherein the EMI shielding material encases the core when subjected to a compressive force.

Another example (e.g. example 8) relates to a previously described example (e.g. one of the examples 1 to 7), wherein the EMI shielding material is a foam material or a gasket material.

Another example (e.g. example 9) relates to a previously described example (e.g. one of the examples 1 to 8), wherein the EMI shielding material is affixed to the core.

Another example (e.g. example 10) relates to a previously described example (e.g. one of the examples 1 to 9), further comprising one or more eyelets.

Another example (e.g. example 11) relates to a previously described example (e.g. example 10), wherein the one or more eyelets are formed in the core or EMI shielding material.

Another example (e.g. example 12) relates to a previously described example (e.g. example 10), wherein the one or more eyelets are affixed to the core or EMI shielding material.

Another example (e.g. example 13) relates to a previously described example (e.g. one of the examples 1 to 12), wherein the shielding structure laterally surrounds an electrical component.

Another example (e.g. example 14) relates to a previously described example (e.g. one of the examples 1 to 13), further comprising a coreless part comprising the EMI shielding material.

Another example (e.g. example 15) relates to a previously described example (e.g. one of the examples 1 to 14), wherein the core extends laterally along a first part of a circumference of the shielding structure and the coreless part extends laterally along a second part of the circumference of the shielding structure.

Another example (e.g. example 16) relates to a previously described example (e.g. one of the examples 1 to 15), further comprising a second core and second coreless part, wherein the core and second core are joined by the coreless part and the second coreless part.

Another example (e.g. example 17) relates to a previously described example (e.g. one of the examples 1 to 16), wherein the core and second core are joined respective proximal ends by the coreless part at respective distal ends by the second coreless part.

Another example (e.g. example 18) relates to a previously described example (e.g. one of the examples 1 to 17), wherein a width of the shielding structure is less than 5 mm.

Another example (e.g. example 19) relates to a previously described example (e.g. one of the examples 1 to 18), wherein a height of the shielding structure is less than 5 mm.

Another example (e.g. example 20) relates to a previously described example (e.g. one of the examples 1 to 19), wherein the core comprises one or more materials selected from the group consisting of: steel, copper, nickel, titanium, aluminum, zinc, brass, rubber, and an elastomer.

Another example (e.g. example 21) relates to a previously described example (e.g. one of the examples 1 to 20), wherein the EMI shielding material comprises one or more materials selected from the group consisting of: electrically conductive elastomers. conductive foam materials. conductive gaskets, metal-coated fabrics, conductive polymers, and conductive composites.

An example (e.g. example 22) relates to an electronic device comprising the shielding structure of a previously described example (e.g. one of the examples 1 to 21), at least partially, laterally surrounding an electrical component on a circuit board; a stiffening structure arranged atop the shielding structure, wherein the stiffening structure applies a compressive force to the shielding structure when affixed to the circuit board.

Another example (e.g. example 23) relates to a previously described example (e.g. example 22), wherein the shielding structure further comprises an eyelet, and the stiffening structure is affixed to the circuit board with a fastener passing through the eyelet.

Another example (e.g. example 24) relates to a previously described example (e.g. one of the examples 22 or 23), wherein the fastener is at least one of a screw, a bolt, and/or a rivet.

Another example (e.g. example 25) relates to a previously described example (e.g. one of the examples 22 to 24), wherein the stiffening structure is a lid or cooling structure.

Another example (e.g. example 26) relates to a previously described example (e.g. one of the examples 22 to 25), wherein the circuit board comprises a groove adapted to the core of the shielding structure.

Another example (e.g. example 27) relates to a previously described example (e.g. one of the examples 22 to 26), wherein the electrical component is at least one of: a processor, a memory device, an integrated circuit, a transistor, and/or a power supply unit.

Another example (e.g. example 28) relates to a previously described example (e.g. one of the examples 22 to 27), wherein the electrical component and shielding structure are arranged between the circuit board and a lid.

An example (e.g. example 29) relates to a method for producing a shielding structure for an electronic component, the method comprising forming a core comprising an elastic material, wherein the core includes at least a spring part comprising one or more arches, and covering at least a part of the core in an EMI shielding material.

Another example (e.g. example 30) relates to a previously described example (e.g. example 29), wherein covering the core in an EMI shielding material comprises layering a first portion of the EMI shielding material beneath the core and layering a second portion of the EMI shielding material atop the core.

An example (e.g. example 31) relates to a system comprising one or more components and a shielding structure, the shielding structure comprising a core comprising an elastic material and at least a spring part of the core comprising an arch, and an EMI shielding material affixed to the core, wherein the shielding structure further laterally surrounds the one or more components.

The aspects and features described in relation to a particular one of the previous examples may also be combined with one or more of the further examples to replace an identical or similar feature of that further example or to additionally introduce the features into the further example.

The following claims are hereby incorporated in the detailed description, wherein each claim may stand on its own as a separate example. It should also be noted that although in the claims a dependent claim refers to a particular combination with one or more other claims, other examples may also include a combination of the dependent claim with the subject matter of any other dependent or independent claim. Such combinations are hereby explicitly proposed unless it is stated in the individual case that a particular combination is not intended. Furthermore, features of a claim should also be included for any other independent claim, even if that claim is not directly defined as dependent on that other independent claim.

What is claimed is:

1. A shielding structure for an electronic component, the shielding structure comprising:
    a core comprising an elastic material and at least a spring part of the core comprising an arch,
        wherein an electromagnetic interference (EMI) shielding material is affixed to the core; and
    a coreless part comprising the EMI shielding material.

2. The shielding structure of claim 1, wherein the core is wire-shaped or ribbon-shaped.

3. The shielding structure of claim 1, wherein the spring part elastically deforms towards a deformable state shape when subjected to a compressive force.

4. The shielding structure of claim 1, wherein the arch comprises at least one of:
    a segmental arch,
    a round arch,
    a triangular arch, or
    a trapezoidal arch.

5. The shielding structure of claim 1, wherein the EMI shielding material is a compressible material.

6. The shielding structure of claim 1, wherein the EMI shielding material is electrically conductive.

7. The shielding structure of claim 1, wherein the EMI shielding material encases the core when subjected to a compressive force.

8. The shielding structure of claim 1, wherein the EMI shielding material is a foam material or a gasket material.

9. The shielding structure of claim 1, wherein the elastic material is metal.

10. The shielding structure of claim 1, further comprising one or more eyelets.

11. The shielding structure of claim 10, wherein the one or more eyelets are formed in the core or EMI shielding material.

12. The shielding structure of claim 1, wherein the shielding structure laterally surrounds an electrical component.

13. The shielding structure of claim 1, wherein the core extends laterally along a first part of a circumference of the shielding structure and the coreless part extends laterally along a second part of the circumference of the shielding structure.

14. The shielding structure of claim 1, further comprising a second core and second coreless part, wherein the core and second core are joined by the coreless part and the second coreless part.

15. The shielding structure of claim 14, wherein the core and second core are joined at respective proximal ends by the coreless part at respective distal ends by the second coreless part.

16. An electronic device comprising:
    a shielding structure comprising a core comprising
        an elastic material and at least a spring part of the core comprising an arch; and
        an EMI shielding material affixed to the core,
    wherein the shielding structure at least partially, laterally surrounds an electrical component on a circuit board, and
    a stiffening structure arranged atop the shielding structure, wherein the stiffening structure applies a compressive force to the shielding structure when affixed to the circuit board.

17. The electronic device of claim 16, wherein the stiffening structure is a lid or cooling structure.

18. The electronic device of claim 16, wherein the circuit board comprises a groove adapted to the core of the shielding structure.

19. A method for producing a shielding structure for an electronic component, the method comprising:
    forming a core comprising an elastic material, wherein the core includes at least a spring part comprising an arch,
    affixing an EMI shielding material to the core, and
    forming a coreless part comprising the EMI shielding material.

* * * * *